(12) United States Patent
Gottheim et al.

(10) Patent No.: US 11,062,939 B2
(45) Date of Patent: Jul. 13, 2021

(54) HIGH BIAS DEPOSITION OF HIGH QUALITY GAPFILL

(71) Applicant: Applied Materials, Inc., Santa Clara, CA (US)

(72) Inventors: Samuel E. Gottheim, Santa Clara, CA (US); Eswaranand Venkatasubramanian, Santa Clara, CA (US); Pramit Manna, Sunnyvale, CA (US); Abhijit Basu Mallick, Palo Alto, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 16/445,654

(22) Filed: Jun. 19, 2019

(65) Prior Publication Data
US 2019/0385907 A1 Dec. 19, 2019

Related U.S. Application Data

(60) Provisional application No. 62/687,234, filed on Jun. 19, 2018.

(51) Int. Cl.
*H01L 21/768* (2006.01)
*H01L 21/683* (2006.01)
(Continued)

(52) U.S. Cl.
CPC .. *H01L 21/76837* (2013.01); *H01J 37/32183* (2013.01); *H01J 37/32449* (2013.01);
(Continued)

(58) Field of Classification Search
CPC .......... H01J 2237/3321; H01J 37/32183; H01J 37/32449; H01J 37/32522; H01J 37/32568; H01L 21/02115; H01L 21/02164; H01L 21/0217; H01L 21/02266; H01L 21/02274; H01L 21/67103; H01L 21/67248; H01L 21/6831; H01L 21/6833; H01L 21/76224; H01L 21/76837; H01L 21/0226; H01L 21/02205
(Continued)

(56) References Cited

U.S. PATENT DOCUMENTS 9,023,731 B2 * 5/2015 Ji .................... H01L 21/02274
438/703
9,721,784 B2 * 8/2017 Behera ............. H01L 21/02115
(Continued)

FOREIGN PATENT DOCUMENTS

WO 2006029388 A2 3/2006

OTHER PUBLICATIONS

PCT International Search Report and Written Opinion in PCT/US2019/037888 dated Oct. 1, 2019. 13 pages.

*Primary Examiner* — Jonathan Han
(74) *Attorney, Agent, or Firm* — Servilla Whitney LLC

(57) ABSTRACT

Embodiments of the present disclosure generally relate to the fabrication of integrated circuits. More particularly, the implementations described herein provide techniques for deposition of high quality gapfill. Some embodiments utilize chemical vapor deposition, plasma vapor deposition, physical vapor deposition and combinations thereof to deposit the gapfill. The gapfill is of high quality and similar in properties to similarly composed bulk materials.

18 Claims, 10 Drawing Sheets

(51) Int. Cl.
*H01L 21/02* (2006.01)
*H01L 21/762* (2006.01)
*H01J 37/32* (2006.01)
*H01L 21/67* (2006.01)

(52) U.S. Cl.
CPC .. *H01J 37/32522* (2013.01); *H01J 37/32568* (2013.01); *H01L 21/0217* (2013.01); *H01L 21/02115* (2013.01); *H01L 21/02164* (2013.01); *H01L 21/67248* (2013.01); *H01L 21/6833* (2013.01); *H01L 21/76224* (2013.01); *H01J 2237/3321* (2013.01)

(58) Field of Classification Search
USPC ......... 257/E21.27, E21.023; 427/249.7, 902; 438/703, 778
See application file for complete search history.

(56) References Cited

U.S. PATENT DOCUMENTS

| | | | |
|---|---|---|---|
| 2008/0202688 | A1 | 8/2008 | Wu et al. |
| 2008/0299775 | A1* | 12/2008 | Wang ................ H01L 21/76229 438/703 |
| 2009/0215281 | A1* | 8/2009 | Mungekar ............. C23C 16/507 438/786 |
| 2012/0015521 | A1* | 1/2012 | Yu ....................... H01L 21/0337 438/703 |
| 2013/0210241 | A1* | 8/2013 | LaVoie .............. H01L 21/76837 438/791 |
| 2014/0045342 | A1* | 2/2014 | Mallick ............... H01L 21/0262 438/778 |

* cited by examiner

HIGH BIAS DEPOSITION OF HIGH QUALITY GAPFILL

CROSS-REFERENCE TO RELATED APPLICATIONS

This application claims priority to U.S. Provisional Application No. 62/687,234, filed Jun. 19, 2018, the entire disclosure of which is hereby incorporated by reference herein.

FIELD

The present disclosure relates generally to methods of depositing thin films. In particular, the disclosure relates to processes for filling narrow trenches with high quality dielectric gap fill.

BACKGROUND

The miniaturization of semiconductor circuit elements has reached a point where feature sizes of 45 nm, 32 nm, 28 nm and even 20 nm are fabricated on a commercial scale. As the dimensions continue to get smaller, new challenges arise for process steps like filling a gap between circuit elements with a variety of materials. As the width between the elements continues to shrink, the gap between them often gets taller and narrower, making the gap more difficult to fill without the gapfill material getting stuck to create voids and weak seams. Conventional chemical vapor deposition (CVD) techniques often experience an overgrowth of material at the top of the gap before it has been completely filled. This can create a void or seam in the gap where the depositing material has been prematurely cut off by the overgrowth; a problem sometimes referred to as breadloafing.

One solution to the breadloafing problem has been to use a gapfill precursor and a plasma-excited precursor combined in a plasma-free substrate processing region to form a nascently-flowable film. The as-deposited flowability allows the film to fill gaps without a seam or void using this chemical vapor deposition technique. Such a chemical vapor deposition has been found to produce better gapfill properties than spin-on glass (SOG) or spin-on dielectric (SOD) processes. While the deposition of flowable films deposited by CVD has fewer breadloafing problems, such techniques are still unavailable for some classes of material.

While flowable CVD techniques represent a significant breakthrough in filling tall, narrow (i.e., high-aspect ratio) gaps with other gapfill materials, there is still a need for techniques that can seamlessly fill such gaps with high quality dielectric materials. For example, previous flowable carbon-based gapfill films have contained a significant amount of oxygen and silicon. These elements significantly alter the properties of the carbon-based gapfill films.

Therefore, there is a need for precursors and methods for depositing high quality gapfill films.

SUMMARY

One or more embodiments of this disclosure are directed to a gapfill deposition method comprising positioning a substrate on an electrostatic chuck within a processing volume of a processing chamber. The substrate having a substrate surface comprising at least one feature therein. The at least one feature extends a depth from the substrate surface to a bottom surface. The at least one feature has an opening width at the substrate surface defined by a first sidewall and a second sidewall. A gapfill precursor is flowed into the processing volume from a gas distribution assembly spaced above the electrostatic chuck while the processing volume is maintained at a pressure between about 0.5 mTorr and about 10 Torr. A plasma is generated in the processing volume above the substrate by applying a first RF bias to the electrostatic chuck to deposit a gapfill within the at least one feature of the substrate. The gapfill comprises substantially no voids.

Additional embodiments of this disclosure are directed to a gapfill deposition method comprising positioning a substrate over a first electrode within a processing volume of a processing chamber. The substrate has a substrate surface comprising at least one feature therein. The at least one feature extends a depth from the substrate surface to a bottom surface. The at least one feature has an opening width at the substrate surface defined by a first sidewall and a second sidewall. The processing chamber further comprises a second electrode positioned above the first electrode and the substrate. The second electrode has a surface comprising a secondary electrode emission material comprising one or more of a silicon-containing material or a carbon-containing material. A gapfill precursor is flowed into the processing volume. A first RF power is applied to at least one of the first electrode and the second electrode. A gapfill is formed within the at least one feature of the substrate. The gapfill comprises substantially no voids.

Further embodiments of this disclosure are directed to a diamond-like carbon gapfill within a feature of a substrate. The gapfill has a density in a range of about 1.8 g/cm$^3$ to about 2.5 g/cm$^3$, from about 50 percent to about 90 percent sp$^a$ hybridized carbon atoms, and a stress of less than 100 MPa. The feature extends a depth from a surface of the substrate to a bottom surface. The feature has an opening width at the surface defined by a first sidewall and a second sidewall. The feature has a ratio of the depth to the opening width of greater than or equal to about 10:1.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Figure 1:
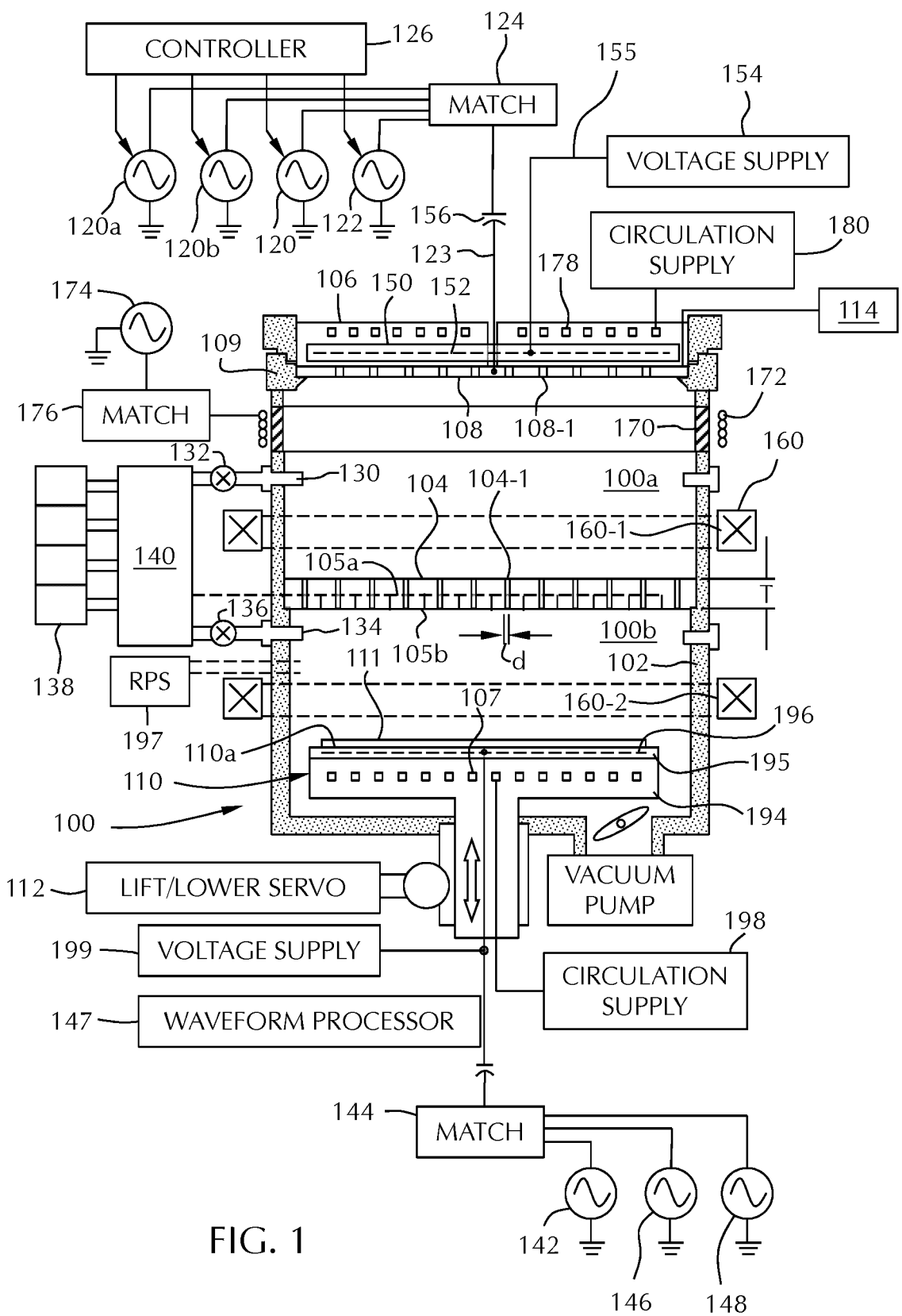
FIG. 1 depicts a schematic illustration of one example of a deposition apparatus in which electron beam plasma technique can be used to practice some embodiments of the disclosure.

As used in this specification and the appended claims, the term "substrate" and "wafer" are used interchangeably, both referring to a surface, or portion of a surface, upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, silicon nitride, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate (or otherwise generate or graft target chemical moieties to impart chemical functionality), anneal and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface. What a given substrate surface comprises will depend on what films are to be deposited, as well as the particular chemistry used.

As used in this specification and the appended claims, the terms "reactive gas", "precursor", "reactant", and the like, are used interchangeably to mean a gas that includes a species which is reactive with a substrate surface. For example, a first "reactive gas" may simply adsorb onto the surface of a substrate and be available for further chemical reaction with a second reactive gas.

The term "about" as used herein means approximately or nearly and in the context of a numerical value or range set forth means a variation of ±15%, or less, of the numerical value. For example, a value differing by ±14%, ±10%, ±5%, ±2%, or ±1%, would satisfy the definition of about.

The following disclosure describes techniques for deposition of high quality gapfill in a feature of a substrate. Certain details are set forth in the following description and in FIGS. 1-8 to provide a thorough understanding of various embodiments of the disclosure. Other details describing well-known structures and systems often associated with plasma processing and gapfill deposition are not set forth in the following disclosure to avoid unnecessarily obscuring the description of the various embodiments.

Many of the details, dimensions, angles and other features shown in the Figures are merely illustrative of particular embodiments. Accordingly, other embodiments can have other details, components, dimensions, angles and features without departing from the spirit or scope of the present disclosure. In addition, further embodiments of the disclosure can be practiced without several of the details described below.

Embodiments described herein will be described below in reference to a PECVD process that can be carried out using any suitable thin film deposition system. Examples of suitable systems include the CENTURA® systems which may use a DXZ® processing chamber, PRECISION 5000® systems, PRODUCER® systems, PRODUCER® GT™ systems, PRODUCER® XP Precision™ systems, PRODUCER® SE™ systems, Sym3® processing chamber, and Mesa™ processing chamber, all of which are commercially available from Applied Materials, Inc., of Santa Clara, Calif. Other tools capable of performing PECVD processes may also be adapted to benefit from the embodiments described herein. In addition, any system enabling the PECVD processes described herein can be used to advantage. The apparatus description described herein is illustrative and should not be construed or interpreted as limiting the scope of the disclosure.

The gapfill described herein may also be deposited in a processing chamber having a multiple frequency capacitively coupled plasma (CCP) configuration surrounded by a ceramic wall. Outside the ceramic wall is an inductively coupled coil, which can inductively enhance the plasma as well. The processing chamber has a top electrode, which is powered by one or more RF generators. The top electrode can also function as the gas distribution showerhead. Feedstock gases can also be injected sideways into the processing chamber for modulation of film uniformity. The processing chamber further includes a bottom electrode, where the wafer is positioned. The bottom electrode is also powered by RF generators and the driven frequency is dependent on the selected deposition scheme.

In some embodiments, a gapfill precursor is introduced into a processing chamber through either a showerhead electrode or a sidewall injection. The processing chamber typically includes a top electrode (e.g., showerhead electrode), a bottom electrode (e.g., pedestal), and an ICP coil which surrounds a portion of the processing chamber. The gapfill precursor may be diluted with an inert gas, such as Ar or He, to increase plasma density. Prior to striking the plasma, a stable operating pressure (e.g., from about 0.1 mTorr to a few Torr) may be established in the processing chamber by a gate valve above the vacuum pump. RF power is applied to at least one of the top electrode, the bottom electrode, and the ICP coil. The top electrode, the bottom electrode, and the ICP coil can be powered simultaneously, or two of the three can be powered simultaneously, depending on the power scheme. The applied RF frequency ranges from a few hundreds of kHz to tens of MHz. Multiple frequencies could also be applied to the top electrode or bottom electrode to optimize ion fluxes and energy incident onto the substrate. After the desired deposition time, power is turned-off and deposition is finished.

The power scheme for the top electrode, the bottom electrode and the ICP coil can be any one of the following power schemes. In some embodiments, only the top electrode is powered. The top electrode could be driven by multiple frequencies at the same time (for example, about 2 MHz and about 40 MHz). In some embodiments, the top electrode and the ICP are powered. ICP can be used as a means to further lower k-value, increase deposition speed or tune uniformity. In some embodiments, only the bottom electrode is powered. The bottom electrode is either high frequency driven (e.g., frequency higher than 13 MHz, for example, 60 MHz) or high frequency and low frequency driven in this configuration. In some embodiments, the bottom electrode and the top electrode are powered simultaneously. In some embodiments, the lower electrode and the ICP are powered simultaneously.

In some embodiments, the top electrode has an electrode surface made of a high secondary electron emission material such as silicon or carbon. As the top electrode is bombarded with ions, secondary electrons emitted due to the ion bombardment are accelerated by the plasma sheath thereby acquiring high energy. Those energetic secondary electrons shoot downwards like electron beams and are very efficient for ionization and dissociation of hydrocarbon molecules. To increase the collision probability, the gaps between the top electrode and the bottom electrode can be increased.

Current gapfill applications largely make use of flowable films that are amorphous in nature but whose properties differ from similar bulk films. In many cases, the bulk film properties are preferred to the properties of the flowable gapfills. Hence there is a need for gapfill, particularly carbon (diamond-like) films and other dielectric materials (e.g., Si, SiN, SiO) with properties similar to bulk materials. For diamond-like carbon materials, the bulk properties sought in the gapfill include, without limitation, high density and modulus (e.g., higher sp3 content, more diamond-like) and low stress (e.g., <−500 MPa).

Some embodiments described herein, provide methods of fabricating carbon gapfill with high density (e.g., >1.8 g/cc), high modulus (e.g., >150 GPa) and low stress (e.g., <−500 MPa). The carbon gapfills produced according to some embodiments described herein not only have a low stress but also have a high sp3 carbon content.

In some embodiments, the gapfill material described herein may be formed by chemical vapor deposition (plasma enhanced and/or thermal) processes using a gapfill precursor. In some embodiments, the gapfill precursor comprises a hydrocarbon and the gapfill comprises a diamond-like carbon material. In some embodiments, the hydrocarbon is selected from a group consisting of: $C_2H_2$, $C_3H_6$, $CH_4$, $C_4H_8$, 1,3-dimethyladamantane, bicyclo[2.2.1]hepta-2,5-diene (2,5-Norbornadiene), adamantine ($C_{10}H_{16}$), norbornene ($C_7H_{10}$), or combinations thereof. In some embodiments, the gapfill precursor comprises a silicon-containing species and the gapfill comprises a dielectric material. In some embodiments, the dielectric material comprises one or more of silicon, silicon oxide or silicon nitride.

The gapfill deposition process may be carried out at temperatures ranging from −50 degrees Celsius to 600 degrees Celsius. The gapfill deposition process may be carried out in a processing volume at pressures ranging from 0.1 mTorr to 10 Torr. The gapfill precursor may further include any one of, or a combination of any of He, Ar, Xe, $N_2$, $H_2$.

In some embodiments, the gapfill precursor may further comprise etchant gases such as $Cl_2$, $CF_4$, $NF_3$ to improve film quality. The plasma (e.g., capacitive-coupled plasma) may be formed from either top and bottom electrodes or side electrodes. The electrodes may be formed from a single powered electrode, dual powered electrodes, or more electrodes with multiple frequencies such as, but not limited to, 350 kHz, 2 MHz, 13.56 MHz, 27 MHz, 40 MHz, 60 MHz and 100 MHz, being used alternatively or simultaneously in a CVD system with any or all of the reactant gases listed herein to deposit a gapfill material in a feature of a substrate.

In some embodiments, hydrogen radicals are fed through an RPS, which leads to selective etching of sp2 hybridized carbon atoms thereby increasing the sp3 hybridized carbon atom fraction of the gapfill further.

FIG. 1 depicts a schematic illustration of one example of a processing chamber 100 in which electron beam plasma techniques can be used to practice some embodiments of the present disclosure. The electron beam plasma chamber has a vacuum chamber body defining the processing chamber 100 including a sidewall 102 of cylindrical shape. The processing chamber 100 is divided by a grid filter 104 into an upper chamber 100a and a lower chamber 100b. The lower chamber 100b is a drift space because of a lack of substantial electric field therein in the absence of an applied bias voltage. A ceiling 106 overlies the upper chamber 100a and supports an electrode 108. In some embodiments, the electrode 108 is formed of a process compatible material such as silicon, carbon, silicon carbon compound, or a silicon-oxide compound. In some embodiments, the electrode 108 is formed of a metal oxide such as aluminum oxide, yttrium oxide, or zirconium oxide. The ceiling 106 and the electrode 108 may be disk-shaped. A bottom surface of the electrode 108 faces the grid filter 104 and is exposed to the interior of the upper chamber 100a. In some embodiments, an insulator or dielectric ring 109 surrounds the electrode 108.

In a particular embodiment, the electrode 108 is formed by a carbon-containing material that may assist in providing carbon sources during a gapfill deposition process. Thus, the electrode 108 may be consumed after a number of the gapfill deposition processes are performed. The material dislodged from the electrode 108 may assist in forming a carbon gapfill layer with high film density by consumption of the materials bombarded from the electrode 108. Thus, periodical replacement of the electrode 108 may be performed to ensure process reliability and repeatability.

In some embodiments, the electrode 108 functions as a showerhead assembly for delivering process gases into the processing chamber 100. In some embodiments, the electrode 108 has a plurality of openings 108-1 for delivering process gases into the processing chamber 100. Gas is supplied from an array of process gas supplies 114 through an array of valves (not shown).

A workpiece support pedestal 110 for supporting a workpiece, e.g., a substrate 111, in the lower chamber 100b has a workpiece support surface 110a facing the grid filter 104 and may be movable in the axial direction by a lift servo 112. In some embodiments, the workpiece support pedestal 110 includes an insulating puck 195 forming the workpiece support surface 110a, a workpiece electrode 196 inside the insulating puck 195, and a chucking voltage supply 199 connected to the workpiece electrode 196. Additionally, a base layer 194 underlying the insulating puck 195 has internal passages 107 for circulating a thermal medium (e.g., a liquid) from a circulation supply 198. The circulation supply 198 may function as a heat sink or as a heat source.

An RF source power generator 120 having a VHF frequency (e.g., 160 MHz) and a lower frequency RF source power generator 122 having a frequency below the VHF range or below the HF range (e.g., in the MF or LF range, e.g., 2 MHz) are coupled to the electrode 108 through an impedance match 124 via an RF feed conductor 123. The RF source power generators 120, 122 are typically capable of producing an RF signal having a frequency from about 0.4 kHz to about 300 MHz and a power between about 0 Watts and about 10,000 Watts. In some embodiments, the impedance match 124 is adapted to provide an impedance match at the different frequencies of the RF source power generators 120 and 122, as well as filtering to isolate the power generators from one another. The output power levels of the RF source power generators 120, 122 are independently controlled by a controller 126. As will be described in detail below, power from the RF source power generators 120, 122 is coupled to the electrode 108. In some embodiments, the ceiling 106 is electrically conductive and is in electrical contact with the electrode 108, and the power from the impedance match 124 is conducted through the ceiling 106 to the electrode 108.

In some embodiments, the sidewall 102 is formed of metal and is grounded. In some embodiments, the surface area of grounded internal surfaces inside the upper chamber 100*a* is at least twice the surface area of the electrode 108. In some embodiments, the grounded internal surfaces inside the processing chamber 100 may be coated with a process compatible material such as silicon, carbon, silicon carbon compound or a silicon-oxide compound. In an alternative embodiment, grounded internal surfaces inside the processing chamber 100 may be coated with a material such as aluminum oxide, yttrium oxide, or zirconium oxide. [0034]

In some embodiments, the RF source power generator 120 may be replaced by two VHF power generators 120*a* and 120*b* that are separately controlled. The VHF power generator 120*a* has an output frequency in a lower portion (e.g., 30 MHz to 150 MHz) of the VHF band, while the VHF power generator 120*b* has an output frequency in an upper portion (e.g., 150 MHz to 300 MHz) of the VHF band. The controller 126 may govern plasma ion density by selecting the ratio between the output power levels of the VHF power generators 120*a* and 120*b*. With the two VHF power generators 120*a* and 120*b*, radial plasma uniformity in the upper chamber 100*a* can be controlled by selecting the gap of upper chamber 100*a* (the distance between the electrode 108 and the grid filter 104) such that by itself the lower VHF frequency produces an edge-high radial distribution of plasma ion density in the upper chamber 100*a* and by itself the upper VHF frequency produces a center-high radial distribution of plasma ion density. With such a selection, the power levels of the two VHF power generators 120*a*, 120*b* are then set to a ratio at which uniformity of radial distribution of plasma ion density is optimized.

In some embodiments, the ceiling 106 is a support for the electrode 108 and includes an insulating layer 150 containing a chucking electrode 152 facing the electrode 108. A DC chucking voltage supply 154 is coupled to the chucking electrode 152 via the feed conductor 155, for electrostatically clamping the electrode 108 to the ceiling 106. A DC blocking capacitor 156 may be connected in series with the output of the impedance match 124. The controller 126 may control the DC chucking voltage supply 154. In some embodiments, the RF feed conductor 123 from the impedance match 124 may be connected to the electrode support or ceiling 106 rather than being directly connected to the electrode 108. In such an embodiment, RF power from the RF feed conductor 123 may be capacitively coupled from the electrode support to the electrode 108. In some embodiments, upper gas injectors 130 provide process gas into the upper chamber 100*a* through a first valve 132. In some embodiments, lower gas injectors 134 provide process gas into the lower chamber 100*b* through a second valve 136. Gas is supplied from an array of process gas supplies 138 through an array of valves 140, which may include the first valve 132 and second valve 136, for example. In some embodiments, gas species and gas flow rates into the upper and lower chambers 100*a*, 100*b* are independently controllable. The controller 126 may govern the array of valves 140. In some embodiments, an inert gas is supplied into the upper chamber 100*a* and a process gas is supplied into the lower chamber 100*b*. The inert gas flow rate may be selected to substantially prevent convection or diffusion of gases from the lower chamber 100*b* into the upper chamber 100*a*, providing substantial chemical isolation of the upper chamber 100*a*.

In some embodiments, plasma may be produced in the upper chamber 100*a* by various bulk and surface processes, including energetic ion bombardment of the interior surface of the top electron-emitting electrode 108. The ion bombardment energy of the electrode 108 and the plasma density are functions of both RF source power generators 120 and 122. The ion bombardment energy of the electrode 108 may be substantially controlled by the lower frequency power from the RF source power generator 122 and the plasma density in the upper chamber 100*a* may be substantially controlled (enhanced) by the VHF power from the RF source power generator 120. Energetic secondary electrons may be emitted from the interior surface of the electrode 108. The flux of energetic electrons from the emitting surface may comprise an electron beam, and may have a direction substantially perpendicular to the interior surface of the electrode 108, and a beam energy of approximately the ion bombardment energy of the electrode 108, which typically can range from about 10 eV to 5000 eV, such as at least greater than 100 eV. The collision cross sections for different processes depend upon the electron energy. At low energies, cross-sections for excitation (and dissociation in molecular gases) are larger than for ionization, while at high energies the reverse is true. The RF power level(s) may be advantageously selected to target various inelastic electron collision processes.

In some embodiments, a side window 170 in the sidewall 102 faces the upper chamber 100*a* and is formed of a material (e.g., quartz or aluminum oxide) through which RF power may be inductively coupled. An inductive coil antenna 172 surrounds the side window 170 and is driven by an optional RF source power generator 174 through an impedance match 176. The RF source power generator 174 to be applied to the inductive coil antenna 172 is controlled at between about 200 watts (W) and about 10 kilowatts. The frequency of the inductively coupled power applied to the inductive coil antenna 172 may be between 2 MHz and about 13 MHz. A remote plasma source 197 may introduce plasma species into the lower chamber 100*b*. In an embodiment having RF source power generator 174 and the inductive coil antenna 172, the plasma density in the upper chamber 100*a* may be substantially controlled (enhanced) by the RF power from the RF source power generator 174. In one example, the RF source power generator 174 and the inductive coil antenna 172 may assist providing a bombardment power to sputter off materials from the electrode 108, thus assisting lodging materials onto a surface of the substrate 111 disposed on the workpiece support pedestal 110.

In some embodiments, the grid filter 104 is of a flat disk shape and may be coaxial with the sidewall 102. The grid filter 104 is formed with an array of plural openings 104-1. In some embodiments, the axial thickness T of the grid filter 104 and the diameter, "d", of the plural openings 104-1 are selected to promote flow through the grid filter 104 of energetic directed beam electrons while impeding flow of non-beam (low energy) electrons and plasma ions through the grid filter 104, and the ratio of grid filter hole area to total grid filter area may be maximized. The energetic electron flux (electron beam) may pass through the grid filter 104 to the lower chamber 100b and may produce a plasma by various electron impact processes in the lower chamber 100b.

The plasma produced by the electron beam in the lower chamber 100b may have different characteristics from the plasma in the upper chamber 100a. The grid filter 104 may function as a filter to substantially electrically isolate the upper and lower chambers 100a, 100b from one another. In some embodiments, the grid filter 104 is formed of a conductive or semiconductive material, and may be connected to ground or may be electrically floating. In some embodiments, the grid filter 104 is formed of a non-conductive material. In some embodiments, the grid filter 104 may be coated with a process compatible material such as silicon, carbon, silicon carbon compound or a silicon-oxide compound. In some embodiments, the grid filter 104 may be coated with a material such as aluminum oxide, yttrium oxide, or zirconium oxide. In some embodiments, the plasma produced in the upper chamber 100a may have high electron density and/or high electron temperature, and have high-energy ions impinging on the electrode 108.

At least a portion of the electron beam, comprised of the secondary electron flux emitted from the electrode 108 due to energetic ion bombardment of the electrode surface, propagates through the grid filter 104 and into the lower chamber 100b, producing a low electron temperature plasma in the lower chamber 100b, with a plasma density that depends upon beam energy and flux, as well as other factors such as pressure and gas composition. The energetic beam electrons may impinge upon the substrate 111 or the workpiece support pedestal 110 upon leaving the plasma region of the lower chamber 100b. The plasma left behind may readily discharge any resultant surface charge caused by the electron beam flux.

Figure 2:
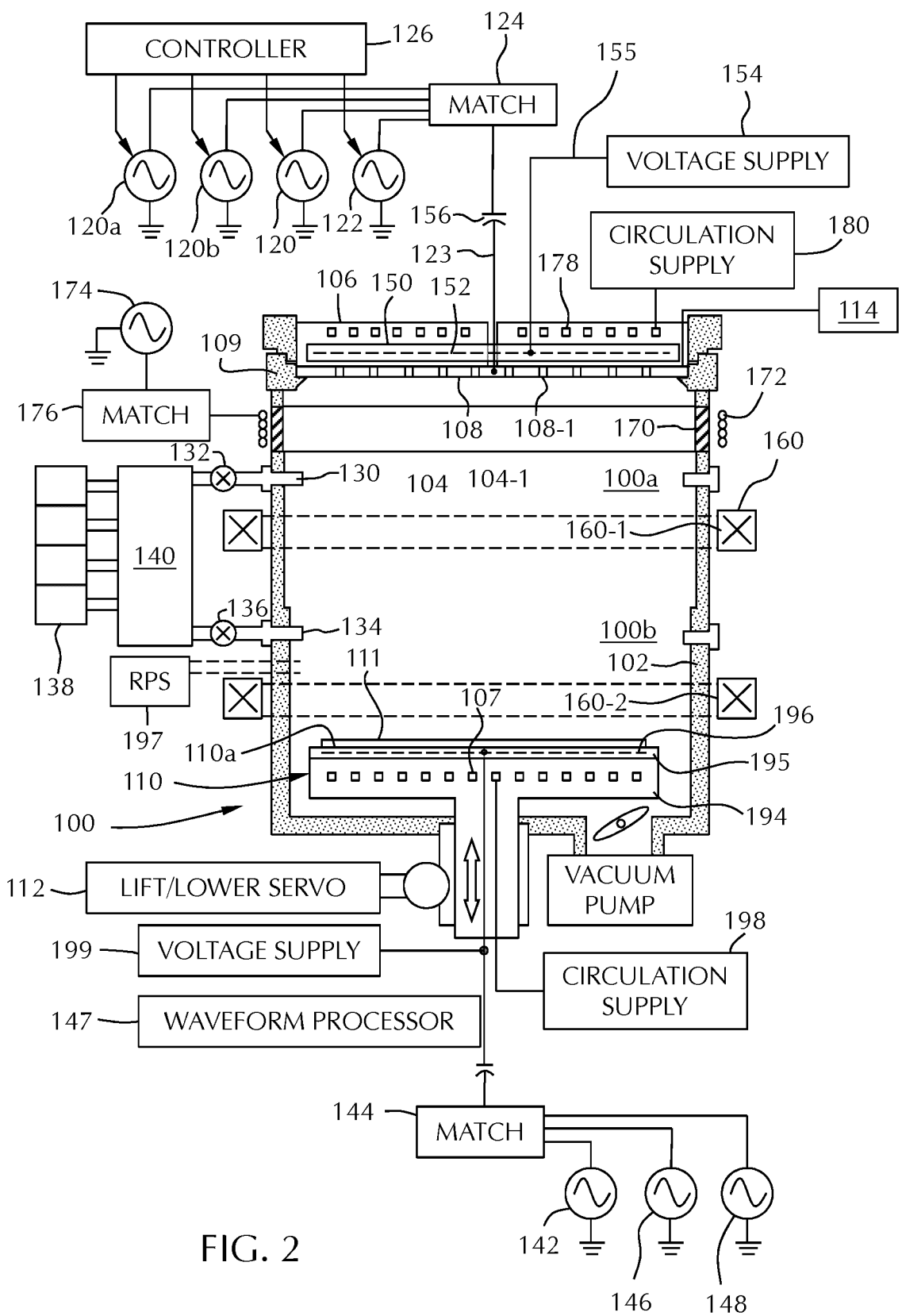
FIG. 2 depicts a schematic illustration of another example of a deposition apparatus in which electron beam plasma technique can be used to practice some embodiments of the disclosure.

In some embodiments where a higher electron beam flux or higher electron beam density is required, the grid filter 104 may be removed or eliminated, as shown in FIG. 2, to assist the secondary electron beam flux emitted from electrode 108 to reach upon the substrate 111 or the workpiece support pedestal 110 at a faster rate. Alternatively, the grid filter 104 may be removed or eliminated, as shown in FIG. 2, in the processing chamber 100 for any process concerns and requirements.

In some embodiments, an electronegative or electron attaching gas such as chlorine is furnished into the chamber, RF and/or VHF power is applied to the electrode 108, RF power is optionally applied to the inductive coil antenna 172, remote plasma source (RPS) power is optionally applied to a remote plasma source (RPS) 197, a plasma is generated in the upper chamber 100a and an accelerating voltage is developed on the electrode 108 with respect to ground and with respect to the plasma. The resulting energetic ion bombardment of the electrode 108 produces secondary electron emission from electrode surface, which constitutes an electron beam flux from the electrode surface. The grid filter 104 allows at least a portion of the electron beam to propagate through the grid filter 104 and into the lower chamber 100b, while preventing at least a portion of non-beam electrons and plasma ions from passing through the grid filter 104, producing a low electron temperature plasma in the lower chamber 100b. The resultant low electron temperature plasma in the lower chamber 100b in an electronegative gas such as chlorine may produce a highly electronegative plasma, with negative ion densities much higher than electron densities and approaching densities of positive ions. Such a plasma is commonly called an ion-ion plasma.

A substantially axially-directed magnetic field, substantially parallel to the electron beam, may be optionally used to help guide the electron beam, improving beam transport through the upper chamber 100a, the grid filter 104 and/or the lower chamber 100b. A low frequency bias voltage or arbitrary waveform of low repetition frequency may be applied to the workpiece support pedestal 110 (e.g., to the workpiece electrode 196) to selectively or alternately extract positive and/or negative ions from said plasma and accelerate those ions at desired energy levels to impact the surface of the substrate 111 for etching, cleaning, deposition, or other materials modification. Radicals produced (a) in the upper chamber 100a, (b) by the electron beam in the lower chamber 100b, (c) by the application of bias voltage to the workpiece support pedestal 110, or (d) by the remote plasma source (RPS) 197, may convect or diffuse to the substrate 111 and participate in reaction on the workpiece surface.

In some embodiments, a relatively inert gas such as helium or argon is furnished into the upper chamber 100a, and electronegative or electron-attaching gas, such as sulfur hexafluoride or carbon fluoride or the like, is flowed into the lower chamber 100b, RF and/or VHF power is applied to the electrode 108, RF power is optionally applied to the inductive coil antenna 172, RPS power is optionally applied to the remote plasma source 197, a plasma is generated in the upper chamber 100a and an accelerating voltage is developed on the electrode 108 with respect to ground and with respect to the plasma. The resulting energetic ion bombardment of the electrode 108 produces secondary electron emission from electrode surface, which constitutes an electron beam flux from the electrode surface. The grid filter 104 allows at least a portion of the electron beam to propagate through the grid filter 104 and into the lower chamber 100b, while preventing at least a portion of nonbeam electrons and plasma ions from passing through the grid filter 104, producing a low electron temperature plasma in the lower chamber 100b.

The resultant low electron temperature plasma in the lower plasma chamber in an electronegative gas may produce a highly electronegative plasma, with negative ion densities much higher than electron densities and approaching densities of positive ions, commonly called an ion-ion plasma.

In some embodiments, the grid filter 104 is a gas distribution plate, having internal gas passages 105a and gas injection outlets 105b. The internal gas passages 105a may be coupled to the array of valves 140.

In some embodiments, an RF bias power generator 142 is coupled through an impedance match 144 to the workpiece electrode 196 of the workpiece support pedestal 110. In a further embodiment, a waveform tailoring processor 147 may be connected between the output of the impedance match 144 and the workpiece electrode 196. The waveform tailoring processor 147 changes the waveform produced by the RF bias power generator 142 to a desired waveform. The ion energy of plasma near the substrate 111 is controlled by the waveform tailoring processor 147. In some embodiments, the waveform tailoring processor 147 produces a waveform in which the amplitude is held during a certain portion of each RF cycle at a level corresponding to a desired ion energy level. The controller 126 may control the waveform tailoring processor 147.

In some embodiments, an RF power generator 146 having a VHF or HF frequency (e.g., 11 MHZ to 60 MHz) and an RF power generator 148 having a frequency below the VHF range or below the HF range (e.g., in the MF or LF range, e.g., 0.4 kHZ to 10 MHz) are coupled to the workpiece electrode 196 through the impedance match 144. The RF power generators 146, 148 are typically capable of producing an RF signal having a frequency from about 0.4 kHz to about 300 MHz and a power between about 0 Watts and about 10,000 Watts. In some embodiments, the RF power generators 146, 148 are RF bias power generators. In some embodiments, the RF power generators 146, 148 are RF source power generators. In some embodiments, the impedance match 124 is adapted to provide an impedance match at the different frequencies of the RF power generators 146 and 148, as well as filtering to isolate the power generators from one another. The output power levels of the RF power generators 146, 148 are independently controlled by the controller 126. As will be described herein, power from the RF power generators 146, 148 is coupled to the workpiece electrode 196. As previously discussed VHF generators may be used.

In some embodiments, a magnet 160 surrounds the processing chamber 100. In some embodiments, the magnet comprises a pair of magnets 160-1, 160-2 adjacent the upper and lower chambers 100a, 100b, respectively. In some embodiments, the pair of magnets 160-1, 160-2 provides an axial magnetic field suitable for confining an electron beam that is propagating from the upper chamber 100a to the lower chamber 100b.

In some embodiments, flow of energetic electrons to the substrate 111 is blocked by a magnetic field having a predominantly radial component (i.e., transverse to the electron beam flow direction) in the region between the grid filter 104 and the substrate 111. This magnetic field may be produced by one of the magnets 160-1 or 160-2, or by another magnet or set of magnets.

In some embodiments, the ceiling 106 includes internal passages 178 for conducting a thermally conductive liquid or media inside the ceiling 106. The internal passages 178 are connected to a thermal media circulation supply 180. The thermal media circulation supply 180 acts as a heat sink or a heat source. The mechanical contact between the electrode 108 and the ceiling 106 is sufficient to maintain high thermal conductance between the electrode 108 and the ceiling 106. In the embodiment shown in FIG. 1, the force of the mechanical contact is regulated by the electrostatic clamping force provided by the DC chucking voltage supply 154.

Figure 3:
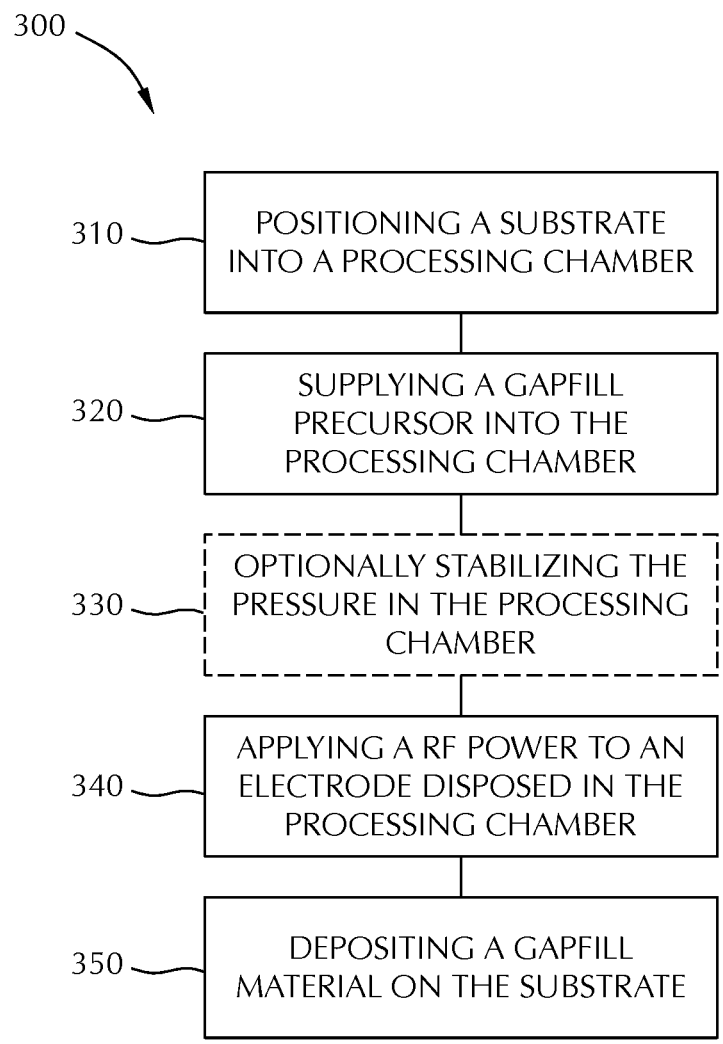
FIG. 3 depicts a flow process diagram of a method for forming gapfill according to some embodiments of the disclosure.
Figure 4A:
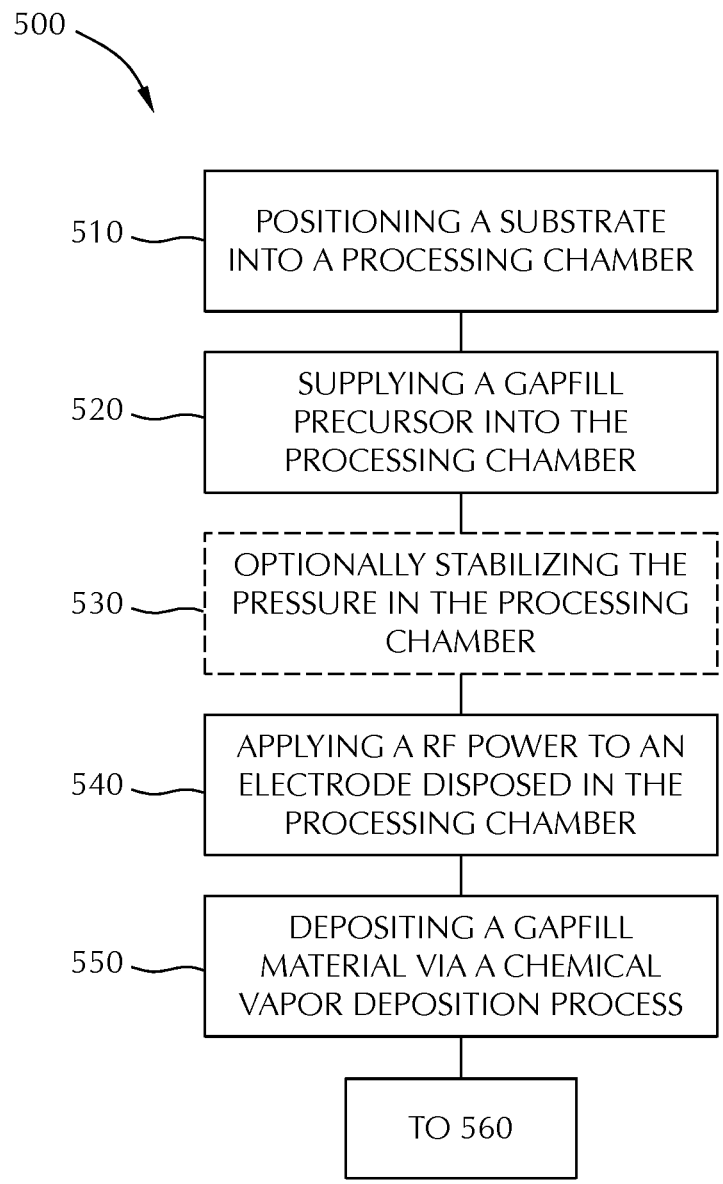
FIGS. 4A-4B depict a flow process diagram of a method for forming gapfill according to some embodiments of the disclosure.
Figure 4B:
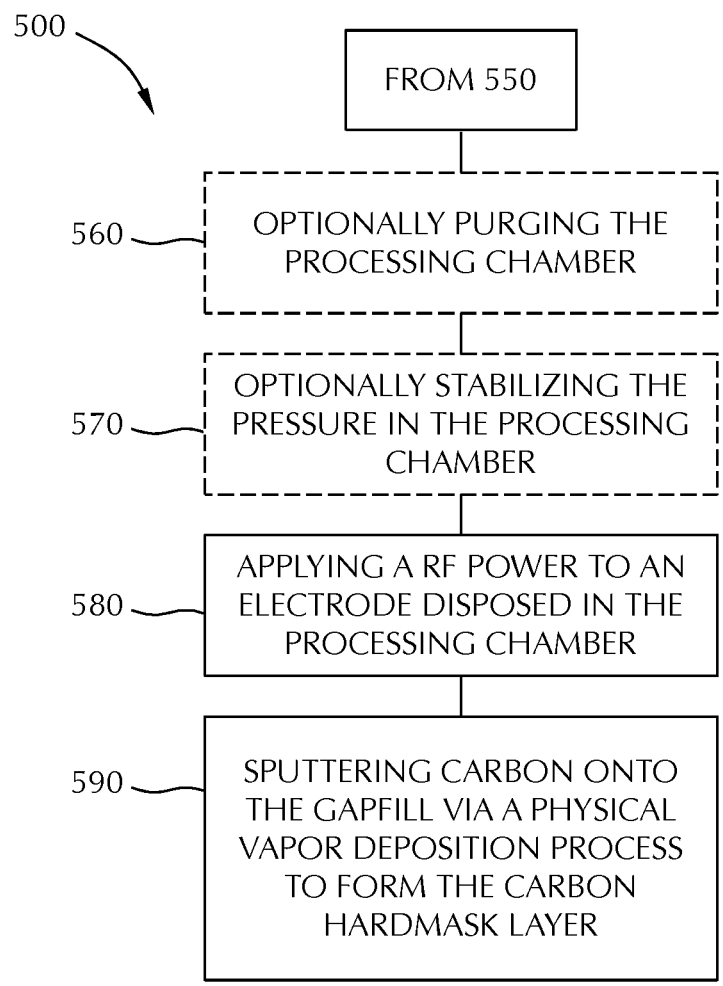

FIG. 3 depicts a flow diagram of a method 300 for forming gapfill in a substrate feature in accordance with one or more embodiments of the present disclosure. FIGS. 4A-4B are cross-sectional views of a substrate illustrating a sequence for forming gapfill in a substrate feature according to the method 300.

The method 300 begins at operation 310 by providing a substrate 111 into a processing chamber, such as the processing chamber 100 depicted in FIG. 1 or 2. Suitable substrates are described elsewhere in this disclosure.

At operation 320, a gapfill precursor is supplied into the processing chamber 100 in preparation for forming gapfill in a substrate feature. The gapfill precursor may be supplied from the process gas supplies 138 through the array of valves 140 to the gas injectors 130, 134 respectively flowing into the processing chamber 100.

In some embodiments, the gapfill precursor comprises a hydrocarbon. Suitable hydrocarbons are discussed at length elsewhere in this disclosure. Additional suitable hydrocarbon compounds include aliphatic hydrocarbons and aromatic hydrocarbons.

Alicyclic hydrocarbons include, for example, cyclopropane, cyclobutane, cyclopentane, cyclopentadiene, toluene and the like. Aromatic hydrocarbons include, for example, benzene, styrene, toluene, xylene, pyridine, ethylbenzene, acetophenone, methyl benzoate, phenyl acetate, phenol, cresol, furan, and the like. Additionally, alpha-terpinene, cymene, 1,1,3,3,-tetramethylbutylbenzene, t-butylether, t-butylethylene, methyl-methacrylate, and tbutylfurfurylether may be suitable.

In some embodiments, the hydrocarbon is selected from: propene, acetylene, ethylene, propylene, butylenes, toluene, alpha-terpinene. In some embodiments, the hydrocarbon is selected from: $C_2H_2$, $C_3H_6$, $CH_4$, $C_4H_8$, 1,3-dimethyladamantane, bicyclo[2.2.1]hepta-2,5-diene (2,5-norbornadiene), adamantine ($C_{10}H_{16}$), norbornene ($C_7H_{10}$), or combinations thereof.

In some embodiments, multiple hydrocarbon compounds may be mixed and supplied to the process chamber as a gapfill precursor. A mixture of two or more hydrocarbon compounds may be used to deposit the gapfill.

In some embodiments, the hydrocarbon comprises or consists essentially of methane ($CH_4$). In some embodiments, the gapfill precursor comprises methane and at least one of propene, acetylene or ethylene.

In some embodiments, the gapfil precursor, such as methane, may be supplied in the gas mixture at a rate between about 50 sccm and about 1000 sccm. The inert gas, such as Ar or He gas, may be supplied in the gas mixture at a rate between about 10 sccm and about 1000 sccm. A hydrogen gas may be supplied in the gas mixture at a rate between about 100 sccm and about 500 sccm. An oxygen gas may be supplied in the gas mixture at a rate between about 0 sccm and about 200 sccm. A nitrogen gas may be supplied in the gas mixture at a rate between about 0 sccm and about 400 sccm. Also, additional hydrocarbons may be supplied into the gas mixture at a flow rate at between about 100 sccm and about 2000 sccm.

In some embodiments, adjustable flow ratio and species may be controlled and supplied from different locations, such as upper or lower gas injectors 130, 134, and the electrode to the processing chamber 100 to maximize radical dissociation and plasma density below or above the grid filter 104. For example, if a higher plasma density is desired in the upper chamber 100a to increase beam electron flux, an inert gas, such as Ar or He, may be supplied through the upper gas injector 130, which may promote electrode bombardment and reduce molecule gas density near the electrode 108 to increase local plasma density and beam electron flux. In contrast, when dissociation of hydrogen molecules is desired (e.g., increasing resultant film purity), a hydrogen containing gas may be supplied through the upper gas injector 130 so as to lower local plasma density but promote hydrogen radical formation to drive out impurities in the processing chamber as well as in the resultant gapfill.

Optionally, at operation 330, the pressure in the processing chamber 100 is stabilized for a predefined RF-on delay time period. The predefined RF-on delay time period is a fixed time delay defined as the time period between introduction of the gapfill precursor into the processing chamber 100 and striking or generating the plasma during operation 340. Any suitable fixed time delay may be used to achieve desired conditions. The length of the RF-on delay time period is typically selected such that the gapfill precursor does not begin to thermally decompose or substantially thermally decompose in the processing chamber 100. The process of operation 330 may be performed simultaneously, sequentially or may partially overlap with the processes of operation 320 and operation 340.

In such an embodiment, the gapfill precursor may be introduced into the processing chamber 100 for a longer time such as between about 5 seconds and about 30 seconds, for example about 15 seconds, which may vary depending upon the size of the substrate. The flowing of the gapfill precursor prior to striking plasma is believed to provide continuous thermal and pressure stabilization of the processing chamber 100. In some embodiments, the gapfill precursor is then flowing into the processing chamber 100 about 0.5 seconds to about 5 seconds, for example about 1 second to about 2 seconds (the flowing time may vary as long as the flow is just long enough for the gapfill precursor to start reaching the interior volume of the processing chamber 100) prior to striking the RF plasma in operation 340.

At operation 340, after the gapfill precursor is supplied into the processing chamber, RF power is supplied to at least one of an upper electrode (e.g., electrode 108), a lower electrode (e.g., workpiece electrode 196), and/or an inductive coil antenna (e.g., the inductive coil antenna 172). At operation 340, after the gas mixture is supplied into the processing chamber, a first RF source power may be generated from the RF source power generators 120, 122, and applied to the electrode 108, to generate plasma and secondary electron beams. Secondary electron beams from the electrode 108 may generate cold plasma, such as a temperature less than 100 degrees Celsius that irradiates a surface of the substrate to form gapfill thereon. Additionally, a second optional RF power may also be applied to the inductive coil antenna 172 through the RF source power generator 174 to add inductively coupled power. The inductively coupled power as generated may increase the radical flux to the substrate and increases the ion flux incident (or beam flux) on the electrons in the upper chamber 100a to produce high density of beam electrons. Inductively coupled power also lowers the sheath voltage on the electrode 108, thus reducing beam energy. Furthermore, a third optional RF power may be applied to the workpiece electrode 196 to optimize ion fluxes and energy incident onto the substrate. The third RF power may be generated by RF power generators 146, 148 and/or additional RF bias power generator 142.

A second source power (e.g., an inductively coupled power) generated from the RF source power generator 174 to be applied to the inductive coil antenna 172 is typically controlled at between about 1 kilowatt and about 10 kilowatts. The frequency of the inductively coupled power applied to the inductive coil antenna 172 may be between 2 MHz and about 13 MHz. In some embodiments, the inductively coupled power may be eliminated and optionally applied as needed. A process pressure, for example between 20 mTorr and about 20 Torr, may also be utilized to form gapfill. It is believed that the electron beam plasma along with the secondary electron beams utilized during the deposition process may provide higher ion bombardment that may enhance dissociation of the ions and energy of the electron beams from the gas mixture, to form gapfill with a robust film structure.

In some embodiments, only the upper electrode (e.g., electrode 108) is powered during operation 340. For example, a first RF source power generated from at least one of the RF source power generators 120, 120a, 120b, 122 is applied to the electrode 108 and controlled at a range of between 1 Kilowatts and about 10 Kilowatts. It is noted that the frequency of the RF source power generators 120, 120a, 120b, 122 may be between 0.4 MHz and about 300 MHz. In this example, power is only applied to the upper electrode (e.g., power is not applied to either the lower electrode (e.g., workpiece electrode 196) or the inductive coil antenna (e.g., the inductive coil antenna 172)). In some embodiments, the frequency applied to the upper electrode is between 0.4 MHz and about 300 MHz. In some embodiments, a high frequency (e.g., between about 11 MHZ and 60 MHz) is applied to the upper electrode. In some embodiments, a low frequency (e.g., between about 0.4 kHz and 10 MHz) is applied to the upper electrode. In some embodiments, multiple frequencies are applied to the upper electrode (e.g., 2 MHz from low frequency RF source power generator 122 and 40 MHz from VHF power generator 120a).

In some embodiments, both the upper electrode (e.g., electrode 108) and the inductive coil antenna (e.g., inductive coil antenna 172) are powered during operation 340. For example, a first RF source power generated from at least one of the RF source power generators 120, 120a, 120b, 122 is applied to the upper electrode and controlled at a range of between 1 Kilowatts and about 10 Kilowatts and a second RF source power is applied to the inductive coil antenna and controlled at between about 1 kilowatts and about 10 kilowatts. In this example, power is applied to both the upper electrode and the inductive coil antenna (e.g., power is not applied to the lower electrode (e.g., workpiece electrode 196)). In some embodiments, the frequency applied to the upper electrode is between about 0.4 MHz and about 300 MHz and the frequency applied to the inductive coil antenna is between about 2 MHz and about 13 MHz. In some embodiments, a high frequency (e.g., between about 11 MHZ and 60 MHz) is applied to the upper electrode and the frequency applied to the inductive coil antenna is between about 2 MHz and about 13 MHz. In some embodiments, a low frequency (e.g., between about 0.4 kHz and 10 MHz) is applied to the upper electrode and the frequency applied to the inductive coil antenna is between about 2 MHz and about 13 MHz. In some embodiments, multiple frequencies are applied to the upper electrode (e.g., 2 MHz from low frequency RF source power generator 122 and 40 MHz from VHF power generator 120a) and the frequency applied to the inductive coil antenna is between about 2 MHz and about 13 MHz. Without being bound by theory, it is believed that the ICP can be used to increase deposition speed and tune uniformity of the deposited gapfill.

In some embodiments, only the lower electrode (e.g., workpiece electrode 196) is powered during operation 340. In embodiments where the lower electrode is powered, the driven frequencies may include a high frequency component. For example, a first RF power (bias or source) generated from at least one of the RF power generators 146, 148 and/or additional RF bias power generator 142 is applied to the lower electrode and controlled at a range of between 1 Kilowatts and about 10 Kilowatts. It is noted that the frequency of the RF power generators 146, 148 and RF bias power generator 142 may be between 0.4 MHz and about 300 MHz. In this example, power is only applied to the lower electrode (e.g., power is not applied to either the upper electrode (e.g., electrode 108) or the inductive coil antenna (e.g., the inductive coil antenna 172)). In some embodiments, the frequency applied to the lower electrode is between 0.4 MHz and about 300 MHz. In some embodiments, a high frequency (e.g., between about 11 MHZ and 60 MHz) is applied to the lower electrode. In some embodiments, multiple frequencies are applied to the lower electrode (e.g., 2 MHz from RF power generator 148 and 40 MHz from RF power generator 146).

In some embodiments, both the upper electrode (e.g., electrode 108) and the lower electrode (e.g., workpiece electrode 196) are powered simultaneously during operation 340 using any of the conditions previously described. For example, an RF source power generated from at least one of the RF source power generators 120, 120a, 120b, 122 is applied to the upper electrode and controlled at a range of between 1 Kilowatts and about 10 Kilowatts and a second RF power (bias or source) is applied to the workpiece electrode 196 and controlled at between about 1 Kilowatts and about 10 Kilowatts. In this example, power is applied to both the electrode 108 and the workpiece electrode 196 (e.g., power is not applied to the inductive coil antenna (e.g., inductive coil antenna 172)). In some embodiments, the frequency applied to the electrode 108 is between about 0.4 MHz and about 300 MHz and the frequency applied to the workpiece electrode 196 is between about 0.4 MHz and about 300 MHz. In some embodiments, multiple frequencies are applied to the electrode 108 and the workpiece electrode 196 (e.g., 2 MHz from a low frequency RF power generator and 40 MHz from a VHF power generator).

In some embodiments, both the inductive coil antenna (e.g., inductive coil antenna 172) and the lower electrode (e.g., workpiece electrode 196) are powered during operation 340. In this example, power is applied to both the inductive coil antenna 172 and the workpiece electrode 196 (e.g., power is not applied to the upper electrode (e.g., electrode 108)). In some embodiments, the frequency applied to the inductive coil antenna 172 is between about 2 MHz and about 13 MHz and controlled at a range of between 1 Kilowatts and about 10 Kilowatts and the frequency applied to the workpiece electrode 196 is between about 0.4 MHz and about 300 MHz and controlled at between about 1 Kilowatts and about 10 Kilowatts.

In some embodiments, multiple frequencies are applied to at least one of the inductive coil antenna 172 and the workpiece electrode 196 (e.g., 2 MHz from a low frequency RF power generator and 40 MHz from a VHF power generator).

In some embodiments, the upper electrode (e.g., electrode 108), the lower electrode (e.g., workpiece electrode 196), and the inductive coil antenna (e.g., inductive coil antenna 172) are powered during operation 340.

During operation 340, the substrate temperature may be controlled between room temperature (e.g., 20 degrees Celsius) and about 1000 degrees Celsius. During operation 340, the spacing between the substrate and showerhead may be controlled at about 1000 mils to about 15000 mils. During operation 340, a process pressure may be maintained at, for example, between 0.1 mTorr and about 20 Torr.

At operation 350, after the deposition process is performed by the process parameters regulated at operation 340, the gapfill is then formed in the substrate feature. In some embodiments, the gapfill as formed herein is configured to have a density between about 1.5 g/cc to about 2.0 g/cc. In some embodiments, the gapfill has a stress of 100 MPa or less.

Embodiments of the present disclosure include methods for depositing gapfill using a combination of plasma induced CVD and physical vapor deposition (PVD). The deposited gapfill density, hardness and stress can be modulated by the relative weight of the CVD component and the PVD component.

With reference to FIG. 1 and FIG. 2, the top electrode (e.g., electrode 108) is driven by one or more RF generators and optionally serves as the gas distribution showerhead. The surface of the top electrode includes a carbon portion and as the plasma sheath accelerates ions, carbon atoms are sputtered and deposited on the wafer surface during the PVD component. The bottom electrode (e.g., workpiece electrode 196) is also powered by RF generators. If the feedstock gases contain hydrocarbon gases, any RF power applied to the top electrode and/or the bottom electrode will dissociate the hydrocarbon gases therefore producing the CVD component. One advantage of adding bias RF power for the CVD component is that hydrocarbon ions can be accelerated to the wafer surface and implanted into the carbon layer to increase the carbon film density and hardness. Strong ion bombardment also helps reduce the film stress, create crosslinking between the PVD layer and the CVD layer thereby improving the film morphology. However, if only the top electrode RF power is present, the deposited film is usually soft and low in density.

In some embodiments of the present disclosure, a gapfill precursor is introduced into a processing chamber through either a showerhead electrode or a sidewall injection. The gapfill precursor may be diluted with an inert gas, such as Ar or He, to increase plasma density. Prior to striking the plasma, a stable operating pressure (e.g., from about 0.1 mTorr to a few Torr) may be established in the processing chamber by a gate valve above the vacuum pump. RF power is applied to at least one of the top electrode, the bottom electrode, and the ICP coil. The top electrode, the bottom electrode, and the ICP coil can be powered simultaneously, or two of the three can be powered simultaneously, depending on the power scheme as previously described herein. The applied RF frequency ranges from a few hundreds of kHz to tens of MHz. Multiple frequencies could also be applied to the top electrode or bottom electrode to optimize ion fluxes and energy incident onto the substrate.

After the desired CVD deposition time, the gapfill precursor may be stopped and the inert gases continue to flow into the chamber. A stable operating pressure (0.1 mTorr to a few tens of mTorr) may be established by a gate valve above the vacuum pump. Typically, the PVD process pressure is extremely low (e.g., between about 1 mTorr and about 10 mTorr) to maximize ion energy. RF power may be applied to the upper electrode and the lower electrode during PVD deposition. During PVD deposition, the bottom RF power could be absent. The top electrode can be powered by multiple RF frequency sources to maximize the sputtering yield. A magnetic field can be used to further enhance plasma density at low pressure thereby increasing the sputtering rate of the carbon. The bottom electrode can be powered to introduce moderate ion bombardment to densify the film and crosslink the PVD and CVD layer. In the RF sputtering regime, the deposited film typically does not have the particle issue. The PVD and CVD processes iteratively run until desired amount of the gapfil is deposited. The sequence of deposition, PVD followed by CVD or CVD followed by PVD can be used.

In some embodiments, the PVD and CVD processes are performed simultaneously. In some embodiments, the CVD film could deposit on the carbon target surface on the top electrode as well, thereby hindering the sputtering process. In some embodiments, an inert purge gas flows either through the top electrode or is peripherally injected into the upper portion of the chamber (e.g., upper chamber 100a), and carbon source gases are injected into the lower portion of the chamber (lower chamber 100b). In doing so, the back diffusion of carbon source gases to the top electrode is minimized, thereby reducing carbon film deposition on the top electrode surface.

In some embodiments, during the CVD process, the powered top electrode also emits secondary electrons due to ion bombardment. The secondary electrons are accelerated by the plasma sheath and have energies on the order of hundreds of eV to keV. As the electron impact ionization cross-section of hydrocarbon gases usually peaks at hundreds of eV, the secondary electrons could significantly contribute to hydrocarbon gas ionization thereby contributing to the increase in film density. Therefore, multiple RF frequencies can be applied to the upper electrode to optimize the secondary electron emission yield while keeping the sheath voltage around hundreds of eV.

An oxygen plasma cleaning process may be performed between the CVD and the PVD step to remove deposited film from the surface of the upper electrode, which may be deposited during the CVD process. In doing so, the sputtering process begins with a clean carbon surface. The oxygen plasma may be formed by flowing an oxygen-containing gas and optionally in inert gas into the processing chamber. The oxygen-containing gas may be selected from the group consisting of: $N_2O$, $O_2$, $O_3$, $H_2O$, and combinations thereof. The optional inert gas may be selected from the group consisting of: helium, argon, and combinations thereof. During the oxygen plasma cleaning process, RF power is supplied to at least one of the upper electrode (e.g., electrode 108) and/or the inductive coil antenna (e.g., the inductive coil antenna 172).

In some embodiments of the oxygen plasma cleaning process, RF power generated from at least one of the RF source power generators 120, 120a, 120b, 122 is applied to the electrode 108 and controlled at a range of between 1 Kilowatts and about 10 Kilowatts. It is noted that the frequency of the RF source power generators 120, 120a, 120b, 122 may be between 0.4 MHz and about 300 MHz. In some embodiments where a second RF source power is used, the second RF source power (e.g., an inductively coupled power) is generated from the RF source power generator 174 to be applied to the coil antenna 172 is typically controlled at between about 1 Kilowatt and about 10 Kilowatts. The frequency of the inductively coupled power applied to the coil antenna 172 may be between 2 MHz and about 13 MHz. A process pressure, for example between 20 mTorr and about 20 Torr, may also be utilized to perform the oxygen plasma cleaning process. The oxygen plasma cleaning process may be performed for a time period sufficient to remove residue from the surface of the electrode 108.

FIGS. 4A-4B depict a flow process diagram of one embodiment of a method 500 for forming gapfill according to some embodiments described herein.

The method 500 begins at operation 510 by providing a substrate 111 into a processing chamber, such as the electron beam plasma processing chamber 100 depicted in FIG. 1 or 2. The substrate 111 may have a substantially planar surface, an uneven surface, or a structure formed thereon.

At operation 520, a gapfill precursor is supplied into the processing chamber 100 in preparation for forming the gapfill on the substrate 111 via chemical vapor deposition ("CVD") process. In some embodiments, the gapfill precursor may be supplied from the process gas supplies 138 through the array of valves 140 to the gas injectors 130, 134 respectively flowing into the processing chamber 100. In some embodiments, the gapfill precursor may be supplied from the process gas supplies 114 flowing into the electrode 108.

The gapfill precursor may comprise a hydrocarbon and an inert gas. The hydrocarbon has been described elsewhere in this disclosure.

In some embodiments, adjustable flow ratio and species may be controlled and supplied from different locations, such as upper or lower gas injectors 130, 134, electrode 108, to the processing chamber 100 to maximize radical dissociation and plasma density below or above the grid filter 104. For example, if a higher plasma density is desired in the upper chamber 100a to increase beam electron flux, an inert gas, such as Ar or He, may be supplied through the upper gas injector 130, which may promote electrode bombardment and reduce molecule gas density near the electrode 108 to increase local plasma density and beam electron flux. In contrast, when dissociation of hydrogen molecules is desired (e.g., increasing resultant film purity), a hydrogen containing gas may be supplied through the upper gas injector 130 so as to lower local plasma density but promote hydrogen radical formation to drive out impurities in the processing chamber as well as in the resultant gapfill.

Optionally, at operation 530, the pressure in the processing chamber is stabilized for a predefined RF-on delay time period similarly to operation 330. Any suitable fixed time delay may be used to achieve desired conditions. The process of operation 530 may be performed simultaneously, sequentially or may partially overlap with the processes of operation 520 and operation 540. In some embodiments, the pressure is stabilized to a pressure from about 0.1 mTorr to about 5 Torr.

In such an embodiment, the gapfill precursor may be introduced into the processing chamber 100 for a longer time such as between about 5 seconds and about 30 seconds, for example about 15 seconds, which may vary depending upon the size of the substrate. The flowing of the gapfill precursor prior to striking plasma is believed to provide continuous thermal and pressure stabilization of the processing chamber 100. In some embodiments, the gapfill precursor is flowing into the processing chamber 100 about 0.5 seconds to about 5 seconds, for example about 1 second to about 2 seconds (the flowing time may vary as long as the flow is just long enough for the gapfill precursor to start reaching the processing chamber 100) prior to striking the RF plasma in operation 540.

At operation 540, after the gapfill precursor is supplied into the processing chamber, RF power is supplied to at least one of the upper electrode (e.g., electrode 108), the lower electrode (e.g., workpiece electrode 196), and/or the inductive coil antenna (e.g., the inductive coil antenna 172). Operation 540 may be performed using any of the power schemes described in relation to operation 340. At operation 540, after the gas mixture is supplied into the processing chamber, a first RF source power may be generated from the RF source power generators 120, 122, and applied to the electrode 108, to generate plasma and secondary electron beams. Secondary electron beams from the electrode 108 may generate cold plasma, such as a temperature less than 100 degrees Celsius that irradiates a surface of the substrate to form the gapfill thereon. Additionally, a second optional RF power may also be applied to the coil antenna 172 through the RF source power generator 174 to add inductively coupled power. The inductively coupled power as generated may increase the radical flux to the substrate and increases the ion flux incident (or beam flux) on the electrons in the upper chamber 100a to produce a high density of beam electrons. Inductively coupled power also lowers the sheath voltage on the electrode 108, thus reducing beam energy. Furthermore, a third optional RF power may be applied to the workpiece electrode 196 to optimize ion fluxes and energy incident onto the substrate. The third RF power may be generated by the RF power generators 146, 148 and/or additional RF bias power generator 142.

In some embodiments where the first RF source power is used, the first RF source power generated from at least one of the RF source power generators 120, 120a, 120b, 122 is applied to the electrode 108 and controlled at a range of between 1 Kilowatts and about 10 Kilowatts. It is noted that the frequency of the RF source power generators 120, 120a, 120b, 122 may be between 0.4 MHz and about 300 MHz. In some embodiments where the second RF source power is used, the second RF source power (e.g., an inductively coupled power) is generated from the RF source power generator 174 to be applied to the coil antenna 172 is typically controlled at between about 1 Kilowatt and about 10 Kilowatts. The frequency of the inductively coupled power applied to the coil antenna 172 may be between 2 MHz and about 13 MHz. In embodiments where the lower electrode is powered, the driven frequencies may include a low frequency component, a high frequency component, or a mixture of both low frequency and high frequency components. For example, an RF bias power is generated from the RF bias power generator 142 is applied to the workpiece electrode 196 and controlled at a range of between 1 Kilowatt and about 10 Kilowatts. It is noted that the frequency of the RF bias power generator 142 may be between 0.4 MHz and about 300 MHz. In some embodiments, multiple frequencies are applied to the workpiece electrode 196 (e.g., 2 MHz from a low frequency RF power generator and 40 MHz from a VHF power generator).

A process pressure, for example between 20 mTorr and about 20 Torr, may also be utilized to form the gapfill. It is believed that the electron beam plasma along with the secondary electron beams utilized during the deposition process may provide higher ion bombardment that may enhance dissociation of the ions and energy of the electron beams from the gas mixture, to form the gapfill with a robust film structure.

During deposition, the substrate temperature may be controlled between from room temperature (e.g., 20 degrees Celsius) and about 1000 degrees Celsius. The spacing between the substrate and showerhead may be controlled at about 200 mils to about 15000 mils (e.g., about 200 mils to about 1000 mils).

As discussed elsewhere, the electron beam plasma and the secondary electron beam provided from the electrode 108 are accelerated by electrode sheath, thus acquiring further energy when entering the bulk plasma. These accelerated electrons provide sufficient high energy to efficiently dissociate hydrogen from the molecules, producing enough hydrogen radicals to extract hydrogen impurities from the carbon films, such as the gapfill formed on the substrate 111, thus forming the gapfill with high purity. The accelerated secondary beam electrons create low temperature plasma, so called cold plasma, above the substrate 111 (at the lower chamber region 100b under the grid filter 104). Low electron temperature often has low electron energy less than 1 eV, such as less than 0.5 eV. Thus, low energy electron from the cold plasma is generated sufficiently to efficiently dissociate hydrogen molecules in vibrational states and produce hydrogen radicals, so as to increase the hydrogen radical flux onto the substrate surface.

Furthermore, as the accelerated secondary electron beam emitted from the electrode 108 reaches to the substrate surface, the high energy carried from the accelerated secondary electron beam, e.g., in the order of hundreds of electron volts (eV) to thousands of electron volts (eV), may induce surface reaction, such as exciting carbon sp3 surface state to form the gapfill on the substrate 111 as well and breaking weak (or undesired) carbon sp or sp2 bonds or even C—H bonds, thus increasing sp3 bonding which may promote formation of the diamond-like carbon material, rather than amorphous state or other structures of the carbon structures. The carbon elements bonded in the gapfill may mostly form in sp3 carbons with four single bonds pointing towards the corner of a tetrahedron bonding with other carbon elements. Undesired sp2 hybridized carbons with two single and one double bond, e.g., the three bonds pointing towards the corners of a triangle, often results in the film structure becoming in amorphous state, rather than desired diamond like structures. The amount of hydrogen termination bonds and the extents of any missing or dangling carbon bonds included in the sp3 hybridized carbons or sp2 hybridized carbons affect how tightly these carbon atoms are networked and packed, thus determining film density and stress. The gapfill is configured to form with complete sp3 hybridization and zero hydrogen content when all carbon atoms are fully interconnected. In one example, the accelerated secondary electron beam may have a beam energy greater than 100 eV.

At operation 550, after the deposition process is performed by the process parameters regulated at operation 540, the gapfill is then formed in the substrate feature.

Optionally, after operation 550 is completed, an optional chamber purge process may be performed to remove any remaining gases and by-products from the chamber from the gapfill formation process. During the chamber purge process, a purge gas (e.g., an inert gas such as argon or nitrogen) may be delivered into the processing chamber 100 from at least one of the electrode 108, the upper gas injector 130, and the lower gas injector 134. In some embodiments, the flow of the gapfill precursor used during operation 540 is stopped while the inert gas used during operation 540 continues to flow and functions as the purge gas. Pressure within the processing chamber 100 may be controlled using a valve system, which controls the rate at which the exhaust gases are drawn from the chamber.

In some embodiments, after operation 550 is completed, an oxygen plasma cleaning process similar to the oxygen plasma cleaning process previously described is performed between the CVD and the PVD process to remove any film deposited on the surface of the upper electrode during the CVD process. In doing so, the carbon surface of the electrode 108 is cleaned prior to beginning the PVD process.

At operation 570, the pressure in the processing chamber is stabilized for a predefined RF-on delay time period similarly to operation 330. Any suitable fixed time delay may be used to achieve desired conditions. The process of operation 530 may be performed simultaneously, sequentially or may partially overlap with the processes of operation 520 and operation 540. In some embodiments, the pressure is stabilized to a pressure from about 0.1 mTorr to about 5 Torr.

The predefined RF-on delay time period is a fixed time delay defined as the time period between performing the CVD process and striking or generating the plasma at operation 580. Any suitable fixed time delay may be used to achieve desired pressure conditions. The length of the RF-on delay time period is typically selected such that the pressure within the processing chamber is stabilized to a desired pressure for the physical chemical vapor deposition process. The process of operation 570 may be performed simultaneously, sequentially or may partially overlap with the processes of operation 560 and operation 580. In some embodiments, the pressure is stabilized to a pressure from about 0.1 mTorr to about 50 mTorr (e.g., between about 1 mTorr and about 10 mTorr). Typically, the PVD process pressure is extremely low to maximize ion energy.

After the desired CVD deposition time, at operation 580, RF power is applied to the upper electrode (e.g., electrode 108) while flowing an inert gas into the processing chamber. The inert gas may be the same inert gas used during the CVD deposition process or the inert gas may be a different inert gas. In some embodiments, the gapfill precursor used during the CVD process is stopped while continuing to flow the inert gas into the chamber. RF power is applied to at least the upper electrode during the PVD process. The upper electrode can be powered by multiple RF frequency sources to maximize the sputtering yield. In some embodiments, RF power is also applied to the lower electrode (e.g., workpiece electrode 196) during the PVD process. The lower electrode can be powered to introduce moderate ion bombardment to densify the film and crosslink the PVD and CVD layers. In some embodiments, a magnetic field can be used to further enhance plasma density at low pressure thereby increasing the sputtering rate of the carbon. For example, a magnetic field may be applied by magnet 160-1 and magnet 160-2. The magnetic field may have a magnetic strength being less than or equal to 1,000 Gauss (e.g., from about 20 Gauss to about 700 Gauss; or from about 100 Gauss to about 500 Gauss).

In some embodiments, only the upper electrode (e.g., electrode 108) is powered during the PVD process of operation 580. For example, a first RF source power generated from at least one of the RF source power generators 120, 120a, 120b, 122 is applied to the electrode 108 and controlled at a range of between 1 Kilowatts and about 10 Kilowatts. It is noted that the frequency of the RF source power generators 120, 120a, 120b, 122 may be between 0.4 MHz and about 300 MHz. In this example, power is only applied to the upper electrode (e.g., power is not applied to either the lower electrode (e.g., workpiece electrode 196) or the inductive coil antenna (e.g., the inductive coil antenna 172)). In some embodiments, the frequency applied to the upper electrode is between 0.4 MHz and about 300 MHz. In some embodiments, a high frequency (e.g., between about 11 MHZ and 60 MHz) is applied to the upper electrode. In some embodiments, a low frequency (e.g., between about 0.4 kHz and 10 MHz) is applied to the upper electrode. In some embodiments, multiple frequencies are applied to the upper electrode (e.g., 2 MHz from low frequency RF source power generator 122 and 40 MHz from VHF power generator 120a).

In yet another example, both the upper electrode (e.g., electrode 108) and the lower electrode (e.g., workpiece electrode 196) are powered simultaneously during operation 580 using any of the conditions previously described. For example, an RF source power generated from at least one of the RF source power generators 120, 120a, 120b, 122 is applied to the upper electrode and controlled at a range of between 1 Kilowatts and about 10 Kilowatts and a second RF power (bias or source) is applied to the lower electrode 196 and controlled at between about 1 Kilowatts and about 10 Kilowatts. In this example, power is applied to both the electrode 108 and the workpiece electrode 196 (e.g., power is not applied to the inductive coil antenna (e.g., inductive coil antenna 172)). In some embodiments, the frequency applied to the electrode 108 is between about 0.4 MHz and about 300 MHz and the frequency applied to the workpiece electrode 196 is between about 0.4 MHz and about 300 MHz. In some embodiments, multiple frequencies are applied to the electrode 108 and/or the workpiece electrode 196 (e.g., 2 MHz from a low frequency RF power generator and 40 MHz from a VHF power generator).

At operation 590, after the deposition process is performed by the process parameters regulated at operation 580, carbon is sputtered onto the gapfill in the substrate 111.

The CVD process (e.g., operations 520-550) and the PVD process (e.g., operations 560-590) may be iteratively run until desired quantity of the gapfill is deposited. In addition, although the sequence of deposition is described as CVD followed by PVD, CVD followed by PVD can also be used.

In some embodiments, the PVD and CVD processes are performed simultaneously. In this embodiment, the CVD film could deposit on the carbon target surface on the top electrode as well, thereby hindering the sputtering process. In some embodiments, an inert purge gas flows either through the top electrode or is peripherally injected into the upper portion of the chamber (e.g., upper chamber 100a), and carbon source gases are injected into the lower portion of the chamber (lower chamber 100b). In doing so, the back diffusion of carbon source gases to the top electrode is minimized, thereby reducing carbon film deposition on the top electrode surface.

In some embodiments, the gapfill as formed herein is configured to have a density greater than or equal to 2.0 g/cm$^3$ (e.g., between about 2.0 g/cm$^3$ to about 2.5 g/cm$^3$. In some embodiments, the gapfill has a stress of 500 MPa or less.

In some embodiments, the temperature of the workpiece support pedestal 110 on which the substrate 111 is positioned may be used to control the stress of the deposited carbon film. It has been found by the inventors that the temperature of the support pedestal has an impact on film stress and can be utilized to decrease film stress. For example, given a specific power/pressure/gas combination, the film stress when the temperature of the support pedestal is 60 degrees Celsius the stress of the deposited gapfill is about −800 MPa. However, when the temperature of the support pedestal is lowered to 10 degrees Celsius the stress of the deposited film is lowered to about −600 MPa. In addition, flowing helium between the workpiece support surface 110a of the support surface and the backside surface of the substrate 111 can be used to modulate film stress. In some embodiments, the helium is run at a pressure between about 15 Torr to about 30 Torr and the temperature of the support pedestal is set to a range from about 20 degrees Celsius to about 700 degrees Celsius.

Thus, methods for forming gapfill having a desired density with low stress are provided by an electron beam plasma deposition process. The methods advantageously provide gapfill with one or more of desired mechanical properties, such as low stress and high density, high etching selectivity or transparency. The improved mechanical properties of the gapfill provide high film quality while maintaining a predetermined range of the film flatness, and stress level.

Figure 6A:
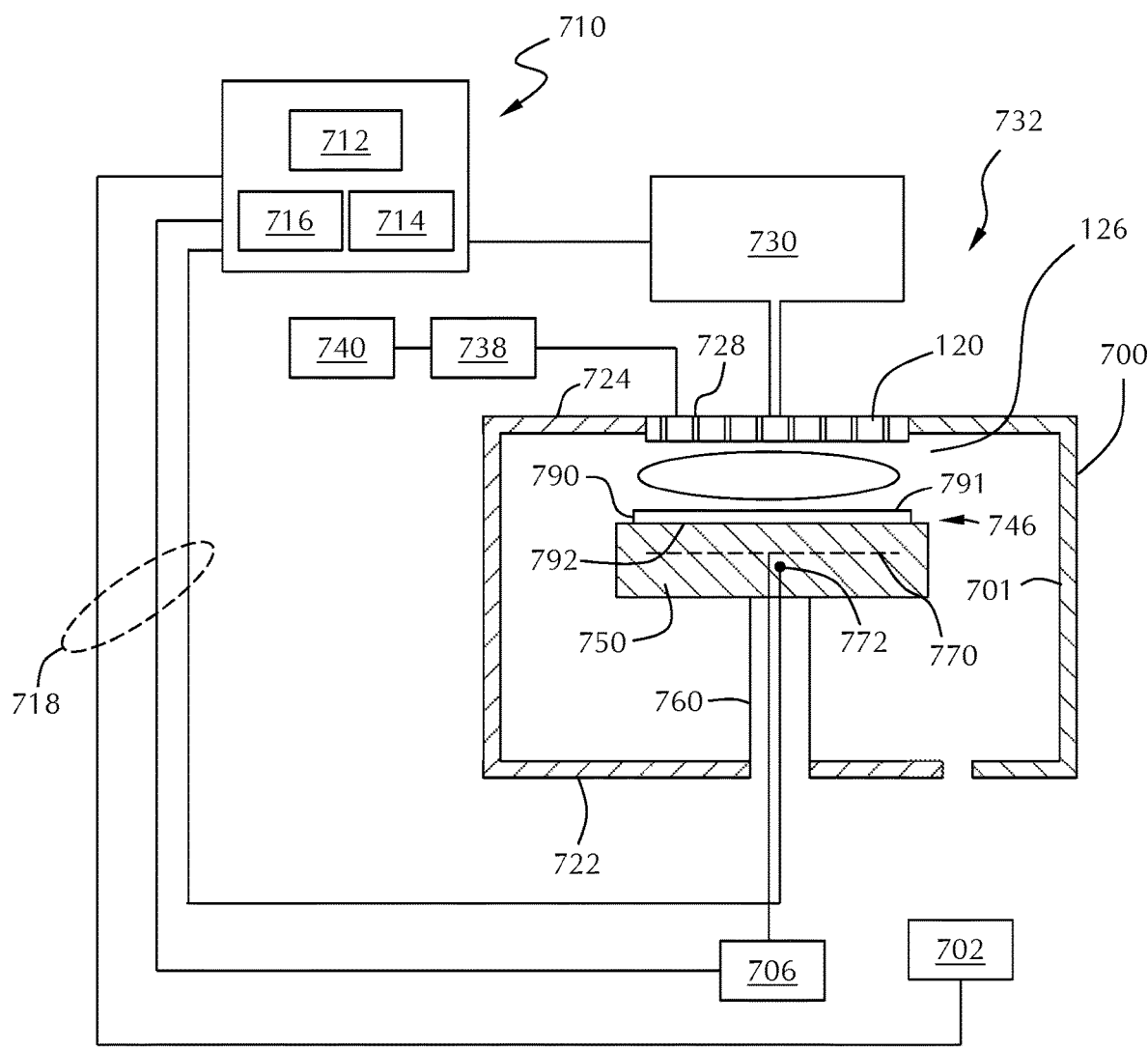
FIG. 6A depicts a schematic cross-sectional view of a deposition system that can be used for the practice of some embodiments of the disclosure.

FIG. 6A depicts a schematic illustration of a substrate processing system 732 that can be used to perform gapfill deposition in accordance with one or more embodiments described herein. The substrate processing system 732 includes a process chamber 700 coupled to a gas panel 730 and a controller 710. The process chamber 700 generally includes a top wall 724, a sidewall 701 and a bottom wall 722 that define a processing volume 726. A substrate support assembly 746 is provided in the processing volume 726 of the process chamber 700. The substrate support assembly 746 generally includes an electrostatic chuck 750 supported by a stem 760. The electrostatic chuck 750 may be typically fabricated from aluminum, ceramic, and other suitable materials. The electrostatic chuck 750 may be moved in a vertical direction inside the process chamber 700 using a displacement mechanism (not shown).

A vacuum pump 702 is coupled to a port formed in the bottom of the process chamber 700. The vacuum pump 702 is used to maintain a desired gas pressure in the process chamber 700. The vacuum pump 702 also evacuates post-processing gases and by-products of the process from the process chamber 700.

The substrate processing system 732 may further include additional equipment for controlling the chamber pressure, for example, valves (e.g., throttle valves and isolation valves) positioned between the process chamber 700 and the vacuum pump 702 to control the chamber pressure.

A gas distribution assembly 720 having a plurality of apertures 728 is disposed on the top of the process chamber 700 above the electrostatic chuck 750. The apertures 728 of the gas distribution assembly 720 are utilized to introduce process gases into the process chamber 700. The apertures 728 may have different sizes, number, distributions, shape, design, and diameters to facilitate the flow of the various process gases for different process requirements. The gas distribution assembly 720 is connected to the gas panel 730 that allows various gases to supply to the processing volume 726 during processing. A plasma is formed from the process gas mixture exiting the gas distribution assembly 720 to enhance thermal decomposition of the process gases resulting in the deposition of material on a surface 791 of the substrate 790.

The gas distribution assembly 720 and the electrostatic chuck 750 may form a pair of spaced apart electrodes in the processing volume 726. One or more RF power source 740 provide a bias potential through an optional matching network 738 to the gas distribution assembly 720 to facilitate generation of plasma between the gas distribution assembly 720 and the electrostatic chuck 750. Alternatively, the RF power source 740 and the matching network 738 may be coupled to the gas distribution assembly 720, the electrostatic chuck 750, or coupled to both the gas distribution assembly 720 and the electrostatic chuck 750, or coupled to an antenna (not shown) disposed exterior to the process chamber 700. In some embodiments, the RF power source 740 may produce power at a frequency of 350 KHz, 2 MHz, 13.56 MHz, 27 MHz, 40 MHz, 60 MHz, or 100 MHz. In some embodiments, the RF power source 740 may provide between about 100 Watts and about 3,000 Watts at a frequency of about 50 kHz to about 13.6 MHz. In some embodiments, the RF power source 740 may provide between about 500 Watts and about 1,800 Watts at a frequency of about 50 kHz to about 13.6 MHz.

The controller 710 includes a central processing unit (CPU) 712, a memory 716, and a support circuit 714 utilized to control the process sequence and regulate the gas flows from the gas panel 730. The CPU 712 may be of any form of a general-purpose computer processor that may be used in an industrial setting. The software routines can be stored in the memory 716, such as random access memory, read only memory, floppy, or hard disk drive, or other form of digital storage. The support circuit 714 is conventionally coupled to the CPU 712 and may include cache, clock circuits, input/output systems, power supplies, and the like.

The controller, which may be included in any of the described processing apparatus, can have a processor, a memory coupled to the processor, input/output devices coupled to the processor and circuits to communication between the different electronic components. The memory can include one or more of transitory memory (e.g., random access memory) and non-transitory memory (e.g., storage).

The memory, or computer-readable medium, of the processor may be one or more of readily available memory such as random access memory (RAM), read-only memory (ROM), floppy disk, hard disk, or any other form of digital storage, local or remote. The memory can retain an instruction set that is operable by the processor to control parameters and components of the system. The support circuits are coupled to the processor for supporting the processor in a conventional manner. Circuits may include, for example, cache, power supplies, clock circuits, input/output circuitry, subsystems, and the like.

Processes may generally be stored in the memory as a software routine that, when executed by the processor, causes the process chamber to perform processes of the present disclosure. The software routine may also be stored and/or executed by a second processor (not shown) that is remotely located from the hardware being controlled by the processor. Some or all of the method of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general purpose computer into a specific purpose computer (controller) that controls the chamber operation such that the processes are performed.

Bidirectional communications between the controller 710 and the various components of the substrate processing system 732 are handled through numerous signal cables collectively referred to as signal buses 718, some of which are illustrated in FIG. 6A.

Figure 6B:
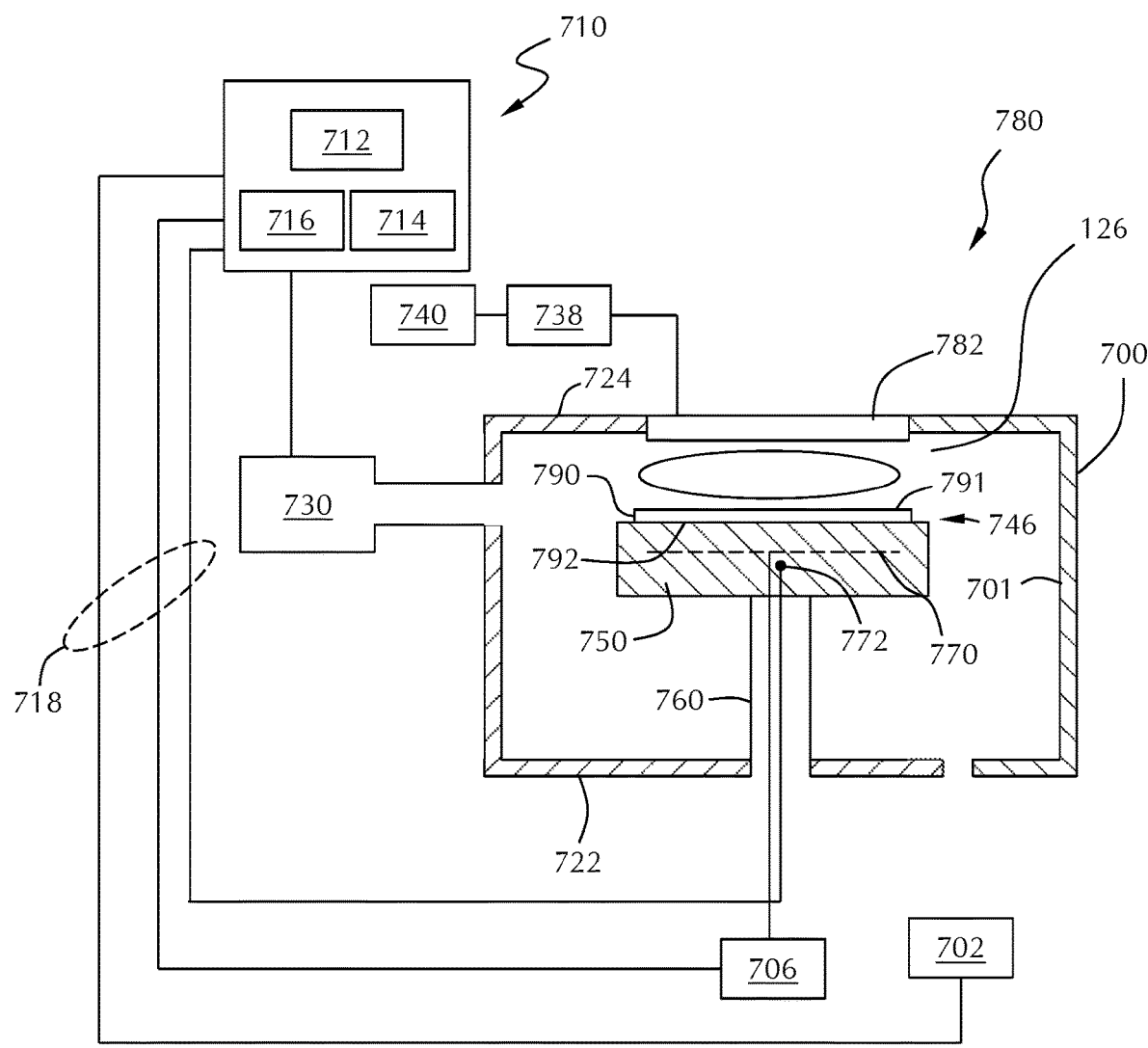
FIG. 6B depicts a schematic cross-sectional view of another deposition system that can be used for the practice of some embodiments of the disclosure.

FIG. 6B depicts a schematic cross-sectional view of another substrate processing system 780 that can be used for the practice of embodiments described herein. The substrate processing system 780 is similar to the substrate processing system 732 of FIG. 6A, except that the substrate processing system 780 is configured to flow processing gases from gas panel 730 across the surface 791 of the substrate 790 via the sidewall 701. In addition, the gas distribution assembly 720 depicted in FIG. 6A is replaced with an electrode 782. The electrode 782 may be configured for secondary electron generation. In some embodiments, the electrode 782 is a silicon-containing electrode.

Figure 7:
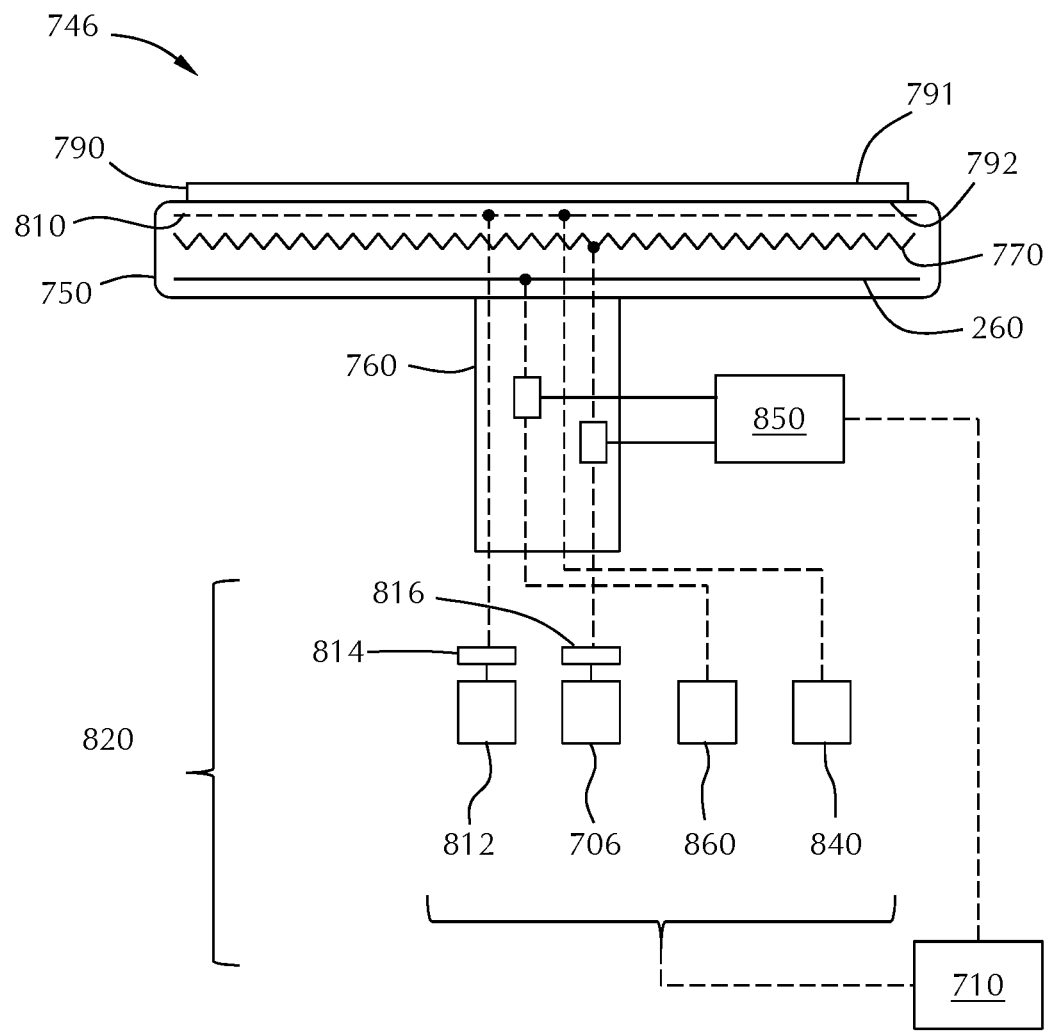
FIG. 7 depicts a schematic cross-sectional view of an electrostatic chuck that may be used in the apparatus of FIG. 6A or FIG. 6B for the practice of some embodiments of the disclosure.

FIG. 7 depicts a schematic cross-sectional view of the substrate support assembly 746 used in the processing systems of FIG. 6A and FIG. 6B that can be used for the practice some embodiments. Referring to FIG. 7, the electrostatic chuck 750 may include an embedded heater element 770 suitable for controlling the temperature of a substrate 790 supported on an upper surface 792 of the electrostatic chuck 750. The electrostatic chuck 750 may be resistively heated by applying an electric current from a heater power source 706 to the heater element 770. The heater power source 706 may be coupled through an RF filter 816. The RF filter 816 may be used to protect the heater power source 706 from RF energy. The heater element 770 may be made of a nickel-chromium wire encapsulated in a nickel-iron-chromium alloy (e.g., INCOLOY®) sheath tube. The electric current supplied from the heater power source 706 is regulated by the controller 710 to control the heat generated by the heater element 770, thereby maintaining the substrate 790 and the electrostatic chuck 750 at a substantially constant temperature during film deposition. The supplied electric current may be adjusted to selectively control the temperature of the electrostatic chuck 750 between about −50 degrees Celsius to about 600 degrees Celsius.

Referring to FIG. 6A and FIG. 6B, a temperature sensor 772, such as a thermocouple, may be embedded in the electrostatic chuck 750 to monitor the temperature of the electrostatic chuck 750 in a conventional manner. The measured temperature is used by the controller 710 to control the power supplied to the heater element 770 to maintain the substrate at a desired temperature.

The electrostatic chuck 750 includes a chucking electrode 810, which may be a mesh of a conductive material. The chucking electrode 810 may be embedded in the electrostatic chuck 750. The chucking electrode 810 is coupled to a chucking power source 812 that, when energized, electrostatically clamps the substrate 790 to the upper surface 792 of the electrostatic chuck 750.

The chucking electrode 810 may be configured as a monopolar or bipolar electrode, or have another suitable arrangement. The chucking electrode 810 may be coupled through an RF filter 214 to the chucking power source 812, which provides direct current (DC) power to electrostatically secure the substrate 790 to the upper surface 792 of the electrostatic chuck 750. The RF filter 214 prevents RF power utilized to form plasma within the process chamber 700 from damaging electrical equipment or presenting an electrical hazard outside the chamber. The electrostatic chuck 750 may be fabricated from a ceramic material, such as AlN or $Al_2O_3$. Alternately, the electrostatic chuck 750 may be fabricated from a polymer, such as polyimide, polyetheretherketone, polyaryletherketone and the like.

A power application system 220 is coupled to the substrate support assembly 746. The power application system 220 may include the heater power source 706, the chucking power source 812, a first radio frequency (RF) power source 830, and a second RF power source 840. Embodiments of the power application system 220 may additionally include the controller 710, and a sensor device 850 that is in communication with the controller 710 and both of the first RF power source 830 and the second RF power source 840.

The controller 710 may also be utilized to control the plasma from the processing gas by application of RF power from the first RF power source 830 and the second RF power source 840 in order to deposit a layer of material on the substrate 790.

As described above, the electrostatic chuck 750 includes the chucking electrode 810 that may function in one aspect to chuck the substrate 790 while also functioning as a first RF electrode. The electrostatic chuck 750 may also include a second RF electrode 860, and together with the chucking electrode 810, may apply RF power to tune the plasma. The first RF power source 830 may be coupled to the second RF electrode 860 while the second RF power source 840 may be coupled to the chucking electrode 810. A first matching network and a second matching network may be provided for the first RF power source 830 and the second RF power source 840, respectively. The second RF electrode 860 may be a solid metal plate of a conductive material as shown. Alternatively, the second RF electrode 860 may be a mesh of conductive material.

The first RF power source 830 and the second RF power source 840 may produce power at the same frequency or a different frequency. In some embodiments, one or both of the first RF power source 830 and the second RF power source 840 may independently produce power at a frequency from about 350 KHz to about 100 MHz (e.g., 350 KHz, 2 MHz, 13.56 MHz, 27 MHz, 40 MHz, 60 MHz, or 100 MHz). In some embodiments, the first RF power source 830 may produce power at a frequency of 13.56 MHz and the second RF power source 840 may produce power at a frequency of 2 MHz, or vice versa. RF power from one or both of the first RF power source 830 and second RF power source 840 may be varied in order to tune the plasma. For example, the sensor device 850 may be used to monitor the RF energy from one or both of the first RF power source 830 and the second RF power source 840. Data from the sensor device 850 may be communicated to the controller 710, and the controller 710 may be utilized to vary power applied by the first RF power source 830 and the second RF power source 840.

The quantity/percentage of sp3 hybridized carbon atoms in the diamond-like carbon material may vary from application to application. In some embodiments, the diamond-like carbon material may contain at least 40, 45, 50, 55, 60, 65, 70, 75, 80, or 85 percent of sp3 hybridized carbon atoms. The diamond-like carbon material may contain up to 45, 50, 55, 60, 65, 70, 75, 80, 85, or 90 percent of sp3 hybridized carbon atoms. The diamond-like carbon material may contain from about 50 to about 90 percent of sp3 hybridized carbon atoms. The diamond-like carbon material may contain from about 60 to about 70 percent of sp3 hybridized carbon atoms.

In general, the following exemplary deposition process parameters may be used to form the gapfill within the substrate feature. The wafer temperature may range from about −50° C. to about 350° C. (e.g., from about 10° C. to about 100° C.; or from about 10° C. to about 50° C.). The chamber pressure may range from a chamber pressure of about 0.5 mTorr to about 10 Torr (e.g., about 2 mTorr to about 50 mTorr; or between about 2 mTorr and about 10 mTorr). The flow rate of the gapfill precursor may be from about 10 sccm to about 1,000 sccm (e.g., from about 100 sccm to about 200 sccm, or from about 750 sccm to about 200 sccm). The flow rate of a dilution gas may individually range from about 50 sccm to about 50,000 sccm (e.g., from about 50 sccm to about 500 sccm; or from about 50 sccm to about 100 sccm). The spacing between the gas distribution assembly and the substrate may be from about 1,000 to about 15,000 mils (e.g., from about 6,000 to about 12,000 mils, or from about 8,000 to about 12,000 mils).

The gapfill may be deposited to a thickness between about 5 Å and about 20,000 Å (e.g., between about 900 Å to about 5000 Å; between about 2000 Å and about 9000 Å, or between about 5 Å to about 200 Å). The above process parameters provide examples of process parameters for a 900 mm substrate in a deposition chamber available from Applied Materials, Inc. of Santa Clara, Calif.

The gapfill may have a refractive index or n-value (n (at 633 nm)) greater than 2.0, for example, approximately 2.0 to approximately 3.0, such as 2.3. The diamond-like carbon material may have an extinction coefficient or k-value (K (at 633 nm)) greater than 0.1, for example, approximately 0.2 to approximately 0.3, such as 0.25.

The diamond-like carbon material may have a stress (MPa) less than about −900 MPa, for example from approximately −600 MPa to approximately −900 MPa, from approximately −600 MPa to approximately −500 MPa, such as approximately −550 MPa.

The diamond-like carbon material may have a density (g/cc) of greater than or equal to about 1.8 g/cm$^3$, for example greater than or equal to about 2.0 g/cm$^3$, or greater than or equal to about 2.5 g/cm$^3$, such as from about 1.8 g/cm$^3$ to about 2.5 g/cm$^3$.

The diamond-like carbon material may film has an elastic modulus (GPa) of greater than 750 GPa, for example, from about 200 to about 10 GPa.

Figure 5A:
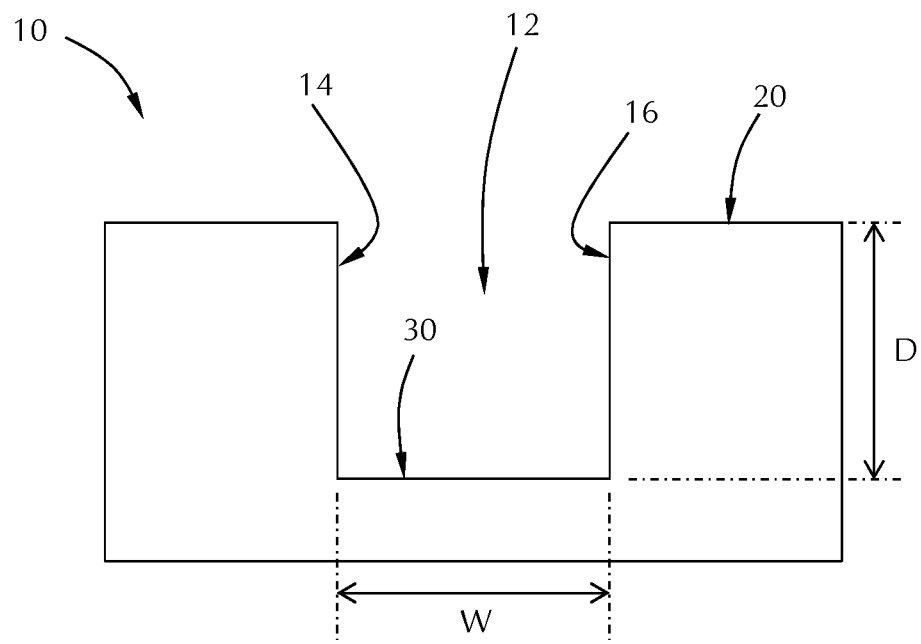
FIGS. 5A and 5B depict a cross section of a substrate before and after processing in accordance with one or more embodiments of the disclosure.
Figure 5B:
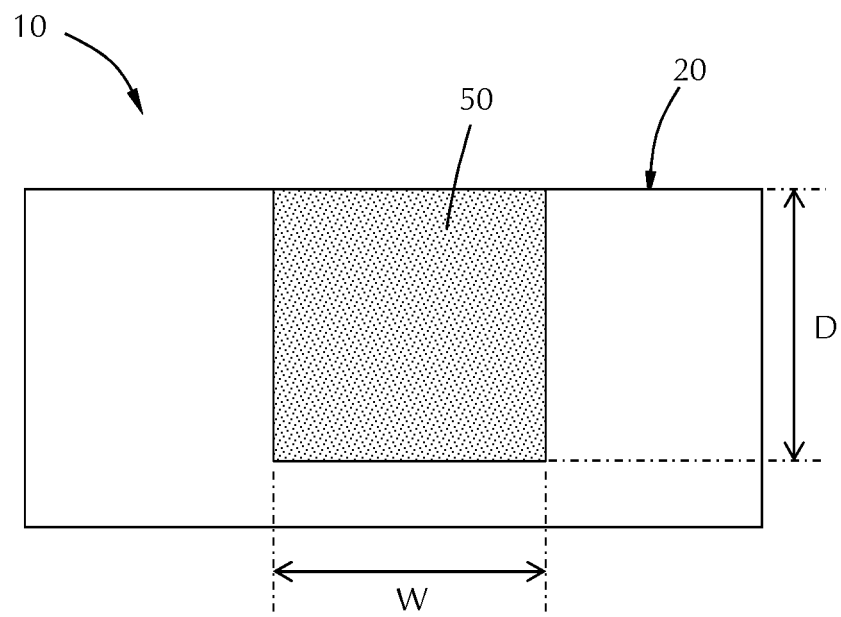
Figure 8:
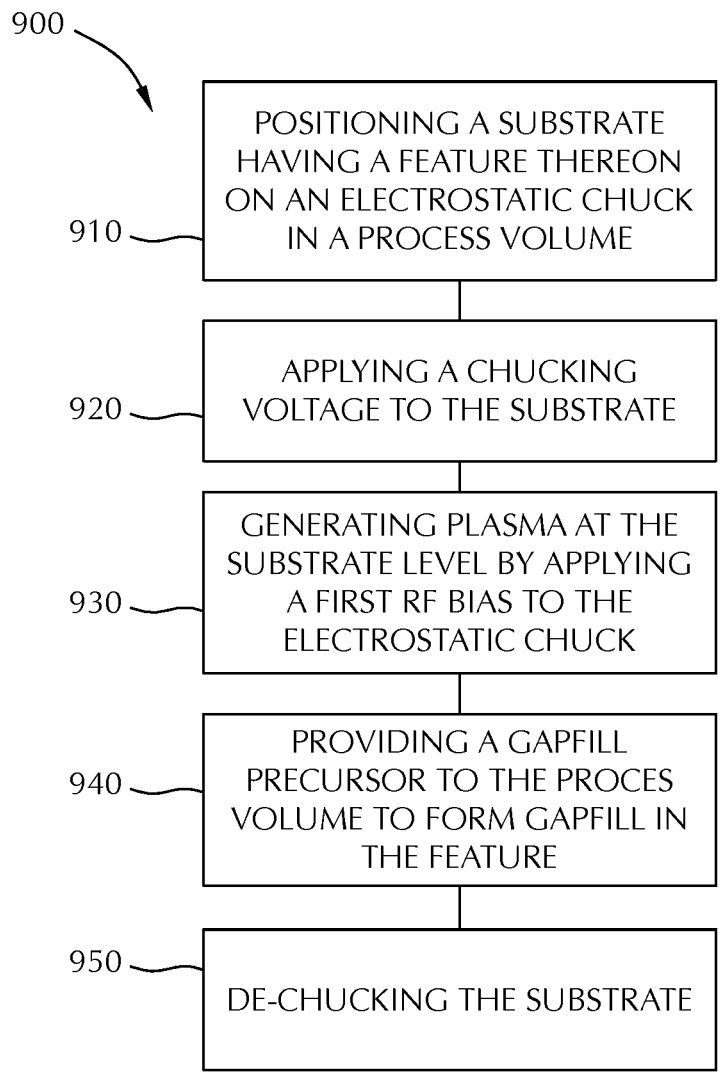
FIG. 8 depicts a flow diagram of a method for forming a high quality gapfill in a feature of a substrate in accordance with one or more embodiments of the disclosure.

FIG. 8 depicts a flow diagram of a method 900 for forming gapfill in a substrate feature in accordance with one or more embodiments of the present disclosure. FIGS. 5A-5B are cross-sectional views of a substrate illustrating a sequence for forming gapfill in a substrate feature according to the method 900. It should be understood that the operations depicted in FIG. 8 may be performed simultaneously and/or in a different order than the order depicted in FIG. 8.

The method 900 begins at operation 910 by positioning a substrate, such as a substrate 10 depicted in FIG. 5A, into a process chamber, such as the process chamber 700 depicted in FIG. 6A or FIG. 6B. The substrate 10 may be substrate 790 depicted in FIG. 6A, FIG. 6B and FIG. 7. The substrate 10 may be positioned on an electrostatic chuck, for example, the upper surface 792 of the electrostatic chuck 750.

FIG. 5A shows a partial cross-sectional view of a substrate 10 with a feature 12. As used in this regard, the term "feature" means any intentional surface irregularity. Suitable examples of features include, but are not limited to trenches, which have a top, two sidewalls and a bottom, valleys which have a top and two sidewalls without a separate bottom, and vias which have sidewalls extending down from a surface with an open bottom or bottom formed by a different material than the sidewalls.

FIGS. 5A and 5B show substrates having a single feature for illustrative purposes; however, those skilled in the art will understand that there can be more than one feature. The shape of the feature 12 can be any suitable shape including, but not limited to, trenches and cylindrical vias.

The substrate 10 has a top surface 20. The at least one feature 12 forms an opening in the top surface 20. The feature 12 extends from the top surface 20 a depth D to a bottom surface 30. The feature 12 has a first sidewall 14 and a second sidewall 16 that define an opening width W of the feature 12. The open area formed by the sidewalls and bottom is also referred to as a gap.

In specific embodiments, the feature 12 is a trench. Features can have any suitable aspect ratio (ratio of the depth D of the feature to the width W of the feature). In some embodiments, the aspect ratio is greater than or equal to about 5:1, 10:1, 15:1, 20:1, 25:1, 30:1, 35:1 or 40:1.

The substrate 10 may be a silicon-based material or any suitable insulating material or conductive material as needed, having a feature 12 disposed on the substrate 10 that may be filled with gapfill 50, as shown in FIG. 5B.

As shown in the exemplary embodiment depicted in FIG. 5A, the substrate 10 may have a top surface 20 that is substantially planar (as shown), uneven, or substantially planar surface having structures formed thereon or additional features formed therein.

In some embodiments, the substrate 10 may be a material such as crystalline silicon (e.g., Si<100> or Si<111>), silicon oxide, strained silicon, silicon germanium, doped or undoped polysilicon, doped or undoped silicon substrates and patterned or non-patterned substrates silicon on insulator (SOI), carbon doped silicon oxides, silicon nitride, doped silicon, germanium, gallium arsenide, glass, sapphire. The substrate 10 may have various dimensions, such as 200 mm, 900 mm, and 450 mm or other diameter substrates, as well as, rectangular or square panels. Unless otherwise noted, embodiments and examples described herein are conducted on substrates with a 200 mm diameter, a 900 mm diameter, or a 450 mm diameter substrate. In the embodiments wherein a SOI structure is utilized for the substrate 10, the substrate 10 may include a buried dielectric layer disposed on a silicon crystalline substrate. In the embodiments depicted herein, the substrate 10 may be a crystalline silicon substrate.

It is noted that the gapfill may be formed on any surfaces or any portion of the substrate 10 inside or outside of the feature 12 present on the substrate 10, including the top surface 20.

In one or more embodiments, the gapfill 50 is deposited and there is substantially no seam formed in the gap. The formation of a seam occurs where the thickness of the film closes on the top part of the feature 12 before the feature is filled with the film, "breadloafing". A seam can be any gap, space or void that forms between the sidewalls 14, 16 of the feature 12.

At operation 920, a chucking voltage is applied to the electrostatic chuck to clamp the substrate 10 to the electrostatic chuck. In some embodiments, where the substrate 10 is positioned on the upper surface 792 of the electrostatic chuck 750, the upper surface 792 provides support and clamps the substrate 10 during processing. The electrostatic chuck 750 flattens the substrate 10 closely against the upper surface 792, preventing backside deposition. An electrical bias is provided to the substrate 10 via chucking electrode 810. The chucking electrode 810 may be in electronic communication with the chucking power source 812 that supplies a biasing voltage to the chucking electrode 810. In some embodiments, the chucking voltage is between about 10 volts and about 9000 volts. In some embodiments, the chucking voltage is between about 100 volts and about 2000 volts. In some embodiments, the chucking voltage is between about 200 volts and about 1000 volts.

During operation 920, several process parameters may be regulated. In some embodiments suitable for processing a 900 mm substrate, the process pressure in the processing volume may be maintained at about 0.1 mTorr to about 10 Torr (e.g., about 2 mTorr to about 50 mTorr; or about 5 mTorr to about 20 mTorr). In some embodiments suitable for processing a 900 mm substrate, the processing temperature and/or substrate temperature may be maintained at about −50 degrees Celsius to about 350 degrees Celsius (e.g., about 0 degrees Celsius to about 50 degrees Celsius; or about 10 degrees Celsius to about 20 degrees Celsius).

In some embodiments, a constant chucking voltage is applied to the substrate 10. In some embodiments, the chucking voltage may be pulsed to the electrostatic chuck 750. In some embodiments, a backside gas may be applied to the substrate 10 while applying the chucking voltage to control the temperature of the substrate. Backside gases may include but are not limited to, helium (He), argon (Ar), or the like.

At operation 930, a plasma is generated at the substrate level by applying a first RF bias to the electrostatic chuck. Plasma generated at the substrate level may be generated in a plasma region between the substrate and the electrostatic chuck. The first RF bias may be from about 10 Watts and about 9000 Watts at a frequency of from about 350 KHz to about 100 MHz (e.g., 350 KHz, 2 MHz, 13.56 MHz, 27 MHz, 40 MHz, 60 MHz, or 100 MHz). In some embodiments, the first RF bias is provided at a power between about 2500 Watts and about 9000 Watts at a frequency of about 13.56 MHz. In some embodiments, the first RF bias is provided to the electrostatic chuck 750 via the second RF electrode 860. The second RF electrode 860 may be in electronic communication with the first RF power source 830 that supplies a biasing voltage to the second RF electrode 860. In some embodiments, the bias power is between about 10 Watts and about 9000 Watts. In some embodiments, the bias power is between about 2000 Watts and about 9000 Watts. In some embodiments, the bias power is between about 8500 Watts and about 9000 Watts. The first RF power source 830 may produce power at a frequency of from about 350 KHz to about 100 MHz (e.g., 350 KHz, 2 MHz, 13.56 MHz, 27 MHz, 40 MHz, 60 MHz, or 100 MHz).

In some embodiments, operation 930 further comprises applying a second RF bias to the electrostatic chuck. The second RF bias may be from about 10 Watts and about 9000 Watts at a frequency of from about 350 KHz to about 100 MHz (e.g., 350 KHz, 2 MHz, 13.56 MHz, 27 MHz, 40 MHz, 60 MHz, or 100 MHz). In some embodiments, the second RF bias is provided at a power between about 800 Watts and about 7200 Watts at a frequency of about 2 MHz. In some embodiments, the second RF bias is provided to the substrate 10 via the chucking electrode 810. The chucking electrode 810 may be in electronic communication with second RF power source 840 that supplies a biasing voltage to the chucking electrode 810. In some embodiments, the bias power is between about 10 Watts and about 9000 Watts. In some embodiments, the bias power is between about 500 Watts and about 7500 Watts. In some embodiments, the bias power is between about 800 Watts and about 7200 Watts. The second RF power source 840 may produce power at a frequency of from about 350 KHz to about 100 MHz (e.g., 350 KHz, 2 MHz, 13.56 MHz, 27 MHz, 40 MHz, 60 MHz, or 100 MHz). In some embodiments, the chucking voltage supplied in operation 920 is maintained during operation 930.

In some embodiments, during operation 930, the first RF bias is provided to the substrate 10 via the chucking electrode 810 and the second RF bias may be provided to the substrate 10 via the second RF electrode 860. In some embodiments, the first RF bias is about 8500 Watts (13.56 MHz) and the second RF bias is about 1000 Watts (2 MHz).

During operation 940, a gapfill precursor is flowed into the processing volume 726 to form the gapfill in the substrate feature. The gapfill precursor may be flowed from the gas panel 730 into the processing volume 726 either through the gas distribution assembly 720 or via the sidewall 701. In some embodiments, the gapfill precursor may further comprise an inert gas, a dilution gas, a nitrogen-containing gas, an etchant gas or combinations thereof. In some embodiments, the gapfill precursor may comprise a hydrocarbon. In some embodiments, the gapfill precursor may comprise a silicon-containing species. The gapfill precursor can be any liquid or gas, though the preferred precursor would be vapor at room temperature to simplify the hardware needed for material metering, control and delivery to the chamber. In some embodiments, the chucking voltage supplied during operation 920 is maintained during operation 940. In some embodiments, the process conditions established during operation 920 and plasma formed during operation 930 are maintained during operation 940.

In some embodiments, the hydrocarbon is gaseous. In some embodiments, the hydrocarbon has a general formula $C_xH_y$, where x has a range of between 1 and 20 and y has a range of between 1 and 26. Suitable hydrocarbons include, for example, $C_2H_2$, $C_3H_6$, $CH_4$, $C_4H_8$, 1,3-dimethyladamantane, bicyclo[2.2.1]hepta-2,5-diene (2,5-norbornadiene), adamantine ($C_{10}H_{16}$), norbornene ($C_7H_{10}$), or combinations thereof. In one example, $C_2H_2$ is preferable due to formation of more stable intermediate species, which allows more surface mobility.

In some embodiments, the hydrocarbon compound is an alkane (e.g., $C_nH_{2n+2}$, wherein n is between 1 and 20). Suitable hydrocarbons include, for example, alkanes such as methane ($CH_4$), ethane ($C_2H_6$), propane ($C_3H_8$), butane ($C_4H_{10}$) and its isomer isobutane, pentane ($C_5H_{12}$), hexane ($C_6H_{14}$) and its isomers isopentane and neopentane, hexane (C6H14) and its isomers 2-methylpentane, 3-methylpentane, 2,3-dimethylbutane, and 2,2-dimethyl butane, or combinations thereof.

In some embodiments, the hydrocarbon is an alkene (e.g., $C_nH_{2n}$, wherein n is between 1 and 20). Suitable hydrocarbons include, for example, alkenes such as acetylene, ethylene, propylene, butylene and its isomers, pentene and its isomers, and the like, dienes such as butadiene, isoprene, pentadiene, hexadiene, or combinations thereof. Additional suitable hydrocarbons include, for example, halogenated alkenes such as monofluoroethylene, difluoroethylenes, trifluoroethylene, tetrafluoroethylene, monochloroethylene, dichloroethylenes, trichloroethylene, tetrachloroethylene, or combinations thereof.

In some embodiments, the hydrocarbon compound is an alkyne (e.g., $C_nH_{2n-2}$, wherein n is between 1 and 20). Suitable hydrocarbons include, for example, alkynes such as acetylene ($C_2H_4$), propyne ($C_3H_4$), butylene ($C_4H8$), vinylacetylene, or combinations thereof.

In some embodiments, the hydrocarbon compound is an aromatic hydrocarbon compound, such as benzene, styrene, toluene, xylene, ethylbenzene, acetophenone, methyl benzoate, phenyl acetate, phenol, cresol, furan, and the like, alpha-terpinene, cymene, 1,1,3,3,-tetramethylbutylbenzene, t-butylether, tbutylethylene, methyl-methacrylate, and t-butylfurfurylether, compounds having the formula $C_3H_2$ and $C_5H_4$, halogenated aromatic compounds including monofluorobenzene, difluorobenzenes, tetrafluorobenzenes, hexafluorobenzene, or combinations thereof.

In some embodiments, the gapfill precursor comprises a silicon-containing species. Suitable silicon-containing species include species similar to the hydrocarbon materials provided above with silicon substituted for carbon. For example, in some embodiments, the silicon-containing species is selected from silanes, higher order silanes, cyclosilanes, halosilanes and combinations thereof.

In some embodiments, the gapfill precursor further comprises one or more dilution gases. Suitable dilution gases such as helium (He), argon (Ar), xenon (Xe). hydrogen ($H_2$), nitrogen ($N_2$), ammonia ($NH_3$), or combinations thereof, among others, may be added to the gas mixture, if desired. Ar, He, and $N_2$ may be used to control the density and deposition rate of the gapfill. In some embodiments, the addition of $N_2$ and/or $NH_3$ can be used to control the hydrogen ratio of the gapfill, as discussed below. Alternatively, dilution gases may not be used during the deposition.

In some embodiments, the gapfill precursor further comprises one or more nitrogen-containing gases. Suitable nitrogen-containing gases include, for example, pyridine, aliphatic amine, amines, nitriles, ammonia and similar compounds.

In some embodiments, the gapfill precursor further comprises an inert gas. In some embodiments, an inert gas, such as argon (Ar) and/or helium (He) may be supplied with the gapfill precursor into the processing volume 726. Other inert gases, such as nitrogen ($N_2$) and nitric oxide (NO), may also be used to control the density and deposition rate of the gapfill. Additionally, a variety of other processing gases may be added to the gapfill precursor to modify properties of the gapfill. In some embodiments, the other processing gases may be reactive gases, such as hydrogen ($H_2$), ammonia ($NH_3$), a mixture of hydrogen ($H_2$) and nitrogen ($N_2$), or combinations thereof. The addition of $H_2$ and/or $NH_3$ may be used to control the hydrogen ratio (e.g., carbon to hydrogen ratio) of the deposited gapfill. The hydrogen ratio present in the diamond-like carbon material provides control over layer properties, such as reflectivity.

In some embodiments, the gapfill precursor further comprises an etchant gas. Suitable etchant gases include chlorine ($Cl_2$), carbon tetrafluoride ($CF_4$), nitrogen trifluoride ($NF_3$), or combinations thereof. Without being bound by theory, it is believed that the etchant gases selectively etch sp2 hybridized carbon atoms from the film thereby increasing the fraction of sp3 hybridized carbon atoms in the film.

In some embodiments, after the gapfill 412 is formed on the substrate during operation 940, the gapfill 412 is exposed to hydrogen radicals. In some embodiments, the gapfill is exposed to hydrogen radicals during the deposition process of operation 940. In some embodiments, the hydrogen radicals formed in an RPS and delivered to the processing region. Without being bound by theory, it is believed that exposing the gapfill to hydrogen radicals leads to selective etching of sp2 hybridized carbon atoms thereby increasing the sp3 hybridized carbon atom fraction of the film.

At operation 950, after the gapfill 412 is formed on the substrate, the substrate is de-chucked. During operation 950, the chucking voltage is turned-off. The reactive gases are turned-off and optionally purged from the processing chamber. In some embodiments, during operation 950 RF power is reduced (e.g., −200 W). Optionally, the controller 710 monitors impedance change to determine whether electrostatic charges are dissipated to ground through the RF path. Once the substrate is de-chucked from the electrostatic chuck, the remaining gases are purged from the processing chamber. The processing chamber is pumped down and the substrate is moved up on the lift pins and transferred out of chamber.

In summary, some of the benefits of the present disclosure provide a process for depositing gapfill in a substrate feature. In some embodiments described herein, low process pressures (mTorr vs. Torr) and bottom driven plasma enables fabrication of gapfill with approximately 60% or greater hybridized sp3 atoms. In addition, some embodiments described herein are performed at low substrate temperatures, which enables the deposition of other dielectric films at much lower temperatures than possible with current processes, opening up applications with low thermal budget that could not be currently addressed by CVD.

When introducing elements of the present disclosure or exemplary aspects or embodiment(s) thereof, the articles "a," "an," "the" and "said" are intended to mean that there are one or more of the elements.

The terms "comprising," "including" and "having" are intended to be inclusive and mean that there may be additional elements other than the listed elements.

While the foregoing is directed to embodiments of the present disclosure, other and further embodiments of the disclosure may be devised without departing from the basic scope thereof, and the scope thereof is determined by the claims that follow.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the invention herein has been described with reference to particular embodiments, it is to be understood that these embodiments are merely illustrative of the principles and applications of the present invention. It will be apparent to those skilled in the art that various modifications and variations can be made to the method and apparatus of the present invention without departing from the spirit and scope of the invention. Thus, it is intended that the present invention include modifications and variations that are within the scope of the appended claims and their equivalents.

What is claimed is:

1. A gapfill deposition method comprising:
   flowing a gapfill precursor into a processing volume of a processing chamber, the gapfill precursor flowed from a gas distribution assembly spaced above a substrate positioned on an electrostatic chuck within the processing volume, the substrate having a substrate surface comprising at least one feature therein, the at least one feature extending a depth from the substrate surface to a bottom surface, the at least one feature having an opening width at the substrate surface defined by a first sidewall and a second sidewall, the processing volume maintained at a pressure between about 0.5 mTorr and about 10 Torr; and
   generating a plasma in the processing volume above the substrate by applying a first RF bias and a second RF bias to the electrostatic chuck to deposit a gapfill within the at least one feature of the substrate, the gapfill comprising substantially no voids.

2. The method of claim 1, wherein the gapfill precursor comprises a hydrocarbon and the gapfill comprises a diamond-like carbon material.

3. The method of claim 2, wherein the diamond-like carbon material has a density greater than 1.8 g/cm3.

4. The method of claim 2, wherein the diamond-like carbon material has a stress in a range of about −600 MPa to about −300 MPa.

5. The method of claim 2, wherein the hydrocarbon is selected from a group consisting of: $C_2H_2$, $C_3H_6$, $CH_4$, $C_4H_8$, 1,3-dimethyladamantane, bicyclo[2.2.1]hepta-2,5-diene (2,5-norbornadiene), adamantine ($C_{10}H_{16}$), norbornene ($C_7H_{10}$), and combinations thereof.

6. The method of claim 1, wherein the gapfill precursor comprises a silicon-containing species and the gapfill comprises a dielectric material.

7. The method of claim 6, wherein the dielectric material comprises one or more of silicon, silicon oxide or silicon nitride.

8. The method of claim 1, wherein the first RF bias is provided at a power between about 10 Watts and about 3000 Watts at a frequency of from about 350 kHz to about 100 MHz.

9. The method of claim 1, wherein the second RF bias is provided at a power between about 10 Watts and about 3000 Watts at a frequency of from about 350 kHz to about 100 MHz.

10. The method of claim 1, wherein the substrate is maintained at a temperature from about 10° C. to about 100° C.

11. The method of claim 1, wherein the gapfill precursor comprises a dilution gas comprising one or more of He, Ar, Xe, N2, H2, or combinations thereof.

12. The method of claim 1, wherein the at least one feature has a ratio of the depth to the opening width of greater than or equal to about 10:1.

13. The method of claim 1, wherein spacing between the gas distribution assembly and the substrate is maintained at 1,000 to 15,000 mils.

14. A gapfill deposition method comprising:
flowing a gapfill precursor into a processing volume of a processing chamber, the processing volume containing a substrate positioned over a first electrode and having a substrate surface comprising at least one feature therein, the at least one feature extending a depth from the substrate surface to a bottom surface, the at least one feature having an opening width at the substrate surface defined by a first sidewall and a second sidewall, the processing chamber further comprising a second electrode positioned above the first electrode and the substrate, the second electrode having a surface comprising a secondary electrode emission material comprising one or more of a silicon-containing material or a carbon-containing material;
applying a first RF power to at least one of the first electrode and the second electrode; and
forming a gapfill within the at least one feature of the substrate, the gapfill comprising substantially no voids.

15. The method of claim 14, wherein the gapfill precursor comprises a hydrocarbon selected from the group consisting of: $C_2H_2$, $C_3H_6$, $CH_4$, $C_4H_8$, 1,3-dimethyladamantane, bicyclo[2.2.1]hepta-2,5-diene (2,5-norbornadiene), adamantine ($C_{10}H_{16}$), norbornene ($C_7H_{10}$), and combinations thereof and the gapfill comprises a diamond-like carbon material.

16. The method of claim 15, wherein the diamond-like carbon material has a density greater than 1.5 g/cm$^3$ and a stress in a range of about −600 MPa to about 100 MPa.

17. The method of claim 14, wherein the gapfill precursor comprises a silicon-containing species and the gapfill comprises a dielectric material comprising one or more of silicon, silicon oxide or silicon nitride.

18. The method of claim 14, wherein the at least one feature has a ratio of the depth to the opening width of greater than or equal to about 10:1.

\* \* \* \* \*